United States Patent
Lee et al.

(10) Patent No.: US 11,764,180 B2
(45) Date of Patent: Sep. 19, 2023

(54) SEMICONDUCTOR DEVICE INCLUDING BASE PILLAR, CONNECTION PAD, AND INSULATION LAYER DISPOSED ON A SUBSTRATE

(71) Applicant: Samsung Electronics Co., Ltd., Suwon-si (KR)

(72) Inventors: Ju-Ik Lee, Anyang-si (KR); Dong-Wan Kim, Hwaseong-si (KR); Seokho Shin, Seoul (KR); Jung-Hoon Han, Hwaseong-si (KR); Sang-Oh Park, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 141 days.

(21) Appl. No.: 17/371,405

(22) Filed: Jul. 9, 2021

(65) Prior Publication Data

US 2021/0335743 A1    Oct. 28, 2021

Related U.S. Application Data

(63) Continuation of application No. 16/455,788, filed on Jun. 28, 2019, now Pat. No. 11,075,183.

(30) Foreign Application Priority Data

Jul. 5, 2018    (KR) .......................... 10-2018-0078250

(51) Int. Cl.
*H01L 23/48*    (2006.01)
*H01L 23/00*    (2006.01)
(Continued)

(52) U.S. Cl.
CPC .......... *H01L 24/17* (2013.01); *H01L 23/3171* (2013.01); *H01L 23/481* (2013.01);
(Continued)

(58) Field of Classification Search
CPC ............... H01L 23/481; H01L 23/5226; H01L 23/5283; H01L 23/3171; H01L 24/17;
(Continued)

(56) References Cited

U.S. PATENT DOCUMENTS

| 6,028,011 A | 2/2000 | Takase et al. |
| 7,274,097 B2 | 9/2007 | Baek et al. |

(Continued)

FOREIGN PATENT DOCUMENTS

| JP | H09-181101 A | 7/1997 |
| JP | 2015-206862 A | 11/2015 |

(Continued)

*Primary Examiner* — Phuc T Dang
(74) *Attorney, Agent, or Firm* — Muir Patent Law, PLLC

(57) ABSTRACT

A semiconductor device includes a semiconductor substrate and a connection terminal, including a base pillar, on the semiconductor substrate. An insulation layer is formed on the semiconductor substrate, the insulation layer including an opening in the insulation layer through which the base pillar extends, wherein a side wall of the insulation layer defining the opening includes a horizontal step at a level that is lower than an uppermost portion of the base pillar.

20 Claims, 35 Drawing Sheets

(51) Int. Cl.
  *H01L 25/18* (2023.01)
  *H01L 23/528* (2006.01)
  *H01L 23/31* (2006.01)
  *H01L 23/522* (2006.01)
(52) U.S. Cl.
  CPC ...... *H01L 23/5226* (2013.01); *H01L 23/5283* (2013.01); *H01L 24/09* (2013.01); *H01L 25/18* (2013.01); *H01L 2224/0401* (2013.01); *H01L 2924/1436* (2013.01)
(58) Field of Classification Search
  CPC . H01L 24/09; H01L 25/18; H01L 2224/0401; H01L 2924/1436
  USPC ....................................................... 257/690
  See application file for complete search history.

(56) References Cited

U.S. PATENT DOCUMENTS

| | | | |
|---|---|---|---|
| 7,638,420 B2 | 12/2009 | Shimoaka | |
| 7,795,128 B2 | 9/2010 | Nakatani | |
| 8,378,505 B2 | 2/2013 | Nakano | |
| 8,980,739 B2* | 3/2015 | Cho | ......................... H01L 24/11 438/614 |
| 9,304,039 B2 | 4/2016 | Tack et al. | |
| 9,735,011 B2 | 8/2017 | Zhao | |
| 9,768,135 B2 | 9/2017 | Yao et al. | |
| 2006/0134875 A1 | 6/2006 | Ahn et al. | |
| 2013/0320522 A1 | 12/2013 | Lai et al. | |
| 2013/0334656 A1 | 12/2013 | Jin et al. | |
| 2015/0279881 A1* | 10/2015 | Shizukuishi | ...... H01L 21/76898 438/67 |
| 2017/0278814 A1* | 9/2017 | Hung | ...................... H01L 24/11 |
| 2018/0090460 A1* | 3/2018 | Chu | .................... H01L 23/3192 |

FOREIGN PATENT DOCUMENTS

| | | |
|---|---|---|
| KR | 10-2002-0058592 A | 7/2002 |
| KR | 10-2016-0116838 A | 10/2016 |
| KR | 1020180060970 A | 6/2018 |

* cited by examiner

SEMICONDUCTOR DEVICE INCLUDING BASE PILLAR, CONNECTION PAD, AND INSULATION LAYER DISPOSED ON A SUBSTRATE

CROSS-REFERENCE TO RELATED APPLICATION

This application is a continuation application of U.S. patent application Ser. No. 16/455,788, filed Jun. 28, 2019 PAT 11075183, which claims the benefit of Korean Patent Application No. 10-2018-0078250, filed on Jul. 5, 2018, in the Korean Intellectual Property Office, the disclosure of each of which is incorporated herein in its entirety by reference.

BACKGROUND

The inventive concept relates to a semiconductor chip and a semiconductor package including the same, and more particularly, to a semiconductor chip including a connection bump and a semiconductor package including the semiconductor chip.

To meet the need for miniaturized, multifunctional, and high-performance electronic products, semiconductor packages are required to be thin and lightweight and have high speed and performance. Therefore, the demand for semiconductor chips for implementing a system having a high memory bandwidth and semiconductor packages including the semiconductor chips is increasing. Since a memory bandwidth is proportional to a data transfer speed and the number of data transfer lines, a memory bandwidth may be increased by increasing a memory working speed or the number of data transfer lines. Therefore, the number and density of connection bumps attached to semiconductor chips are increasing.

SUMMARY

Embodiments according to the present inventive concept include a semiconductor chip including a plurality of connection bumps increased in number and density, and a semiconductor package including the semiconductor chip. Pursuant to these embodiments, a semiconductor device can include a semiconductor substrate and a connection terminal, including a base pillar, on the semiconductor substrate. An insulation layer on the semiconductor substrate can include an opening in the insulation layer through which the base pillar extends, wherein a side wall of the insulation layer defining the opening includes a horizontal step at a level that is lower than an uppermost portion of the base pillar.

In some embodiments, a semiconductor device can include a semiconductor substrate, an external connection terminal on the semiconductor substrate, and an insulation layer on the semiconductor substrate. The external connection terminal comprises a microbump structure, with a connection base pillar included in the microbump structure. The insulation layer includes an opening in the insulation layer through which the base pillar extends, wherein a side wall of the insulation layer on a first side of the opening includes a lower side wall that is inclined downward toward the base pillar to have a first slope relative to an upper surface of the semiconductor substrate and an upper side wall, above the lower side wall, that is inclined downward toward the base pillar to have a second slope relative to the upper surface of the semiconductor substrate that is different from the first slope.

In some embodiments, a semiconductor device includes a semiconductor package main board and a processor chip on the semiconductor package main board. An interposer is between the processor chip and the semiconductor package main board, where the processor chip is directly mounted on the interposer. A buffer chip is directly mounted on the interposer and is horizontally spaced apart from the processor chip, where the buffer chip can include a first connection terminal including a first base pillar on the buffer chip, the first base pillar having a first aspect ratio, and an insulation layer can be on the buffer chip, where the insulation layer includes an opening in the insulation layer through which the first base pillar extends, wherein a side wall of the insulation layer defining the opening includes a horizontal step at a level that is recessed relative to a portion of the first base pillar that protrudes a maximum distance from a substrate of the buffer chip. A high bandwidth dynamic random access memory chip can be mounted on the buffer chip, where the high bandwidth dynamic random access memory chip includes a second connection terminal including a second base pillar having a second aspect ratio that is less than the first aspect ratio.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
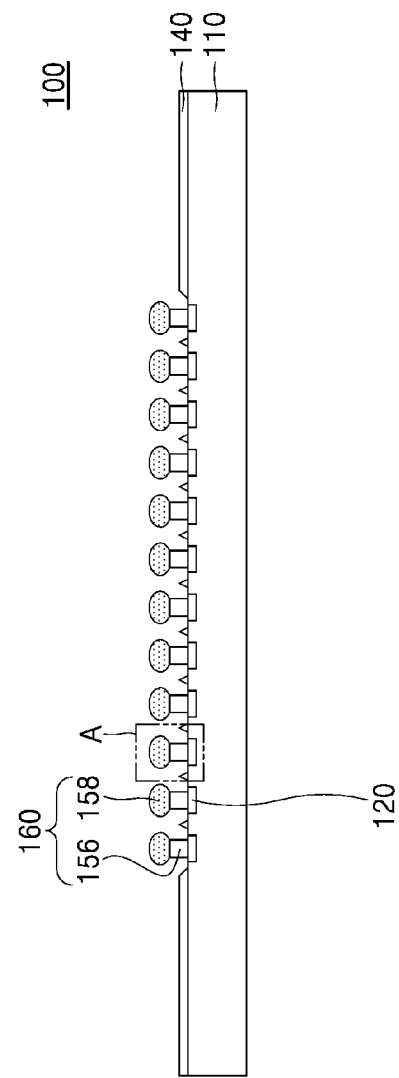
FIG. 1 is cross-sectional view illustrating a semiconductor chip according to an embodiment.

FIG. 1 is cross-sectional view illustrating a semiconductor chip 100 according to an embodiment.

Referring to FIG. 1, the semiconductor chip 100 may include a semiconductor substrate 110 and a connection pad 120 disposed on an active surface which is an upper surface of the semiconductor substrate 110.

In the specification, an upper surface and a lower surface of a semiconductor substrate may respectively denote an active surface and an inactive surface of the semiconductor substrate. That is, even when the active surface of the semiconductor substrate is disposed under the inactive surface in a final product, the active surface of the semiconductor substrate may be referred to as an upper surface of the semiconductor substrate, and the inactive surface of the semiconductor substrate may be referred to as a lower surface of the semiconductor substrate. Also, the terms "upper surface" and "lower surfaces" may be respectively applied to an element disposed on the active surface and an element disposed on the inactive surface.

The semiconductor substrate 110 may be or may include, for example, silicon (Si). Alternatively, the semiconductor substrate 110 may be or may include a semiconductor element such as germanium (Ge), or may be or include a compound semiconductor such as silicon carbide (SiC), gallium arsenide (GaAs), indium arsenide (InAs), or indium phosphide (InP). The semiconductor substrate 110 may include an active surface and an inactive surface opposite to the active surface. An integrated circuit, which includes various kinds of a plurality of individual devices and is provided on the active surface, may be provided in the semiconductor chip 100.

The semiconductor chip 100 may be, for example, a central processing unit (CPU) chip, a graphic processing unit (GPU) chip, or an application processor (AP) chip. The semiconductor chip 100 may be, for example, a dynamic random access memory (DRAM) chip, a static random access memory (SRAM) chip, a flash memory chip, an electrically erasable and programmable read-only memory (EEPROM) chip, a phase-change random access memory (PRAM) chip, a magnetic random access memory (MRAM) chip, or a resistive random access memory (RRAM) chip. The semiconductor chip 100 may comprise a die formed from a semiconductor wafer.

In some embodiments, the semiconductor chip 100 may be a buffer chip including a serial-parallel conversion circuit. The buffer chip may be disposed between a memory chip and a controller chip. The buffer chip may serialize a data signal received from the memory chip to transfer a serialized data signal to the controller chip and may parallelize a data signal received from the controller chip to transfer a parallelized data signal to the memory chip.

The connection pad 120 may include an electrically conductive material. For example, the connection pad 120 may include at least one of nickel (Ni), aluminum (Al), copper (Cu), gold (Au), silver (Ag), platinum (Pt), and tungsten (W). In FIG. 1, the connection pad 120 is illustrated as being buried in the semiconductor substrate 110, but it is not limited thereto. In some embodiments, the connection pad 120 may protrude from the upper surface of the semiconductor substrate 110.

An insulation layer 140 may be disposed on the upper surface of the semiconductor substrate 110. The insulation layer 140 may expose the connection pad 120 and may cover a portion of the upper surface of the semiconductor substrate 110. The insulation layer 140 may include, for example, photosensitive polyimide (PSPI). The insulation layer 140 may include a first horizontal part (140P1 of FIG. 2A) adjacent to the semiconductor substrate 110 and a second horizontal part (140P2 of FIG. 2A) on the first horizontal part 140P1. The first horizontal part 140P1 and the second horizontal part 140P2 may be parts of the insulation layer 140 provided as one body (e.g., an integral structure). The first horizontal part 140P1 may be a part configuring one layer at a lower portion of the insulation layer 140, and the second horizontal part 140P2 may be a part configuring another layer on the first horizontal part 140P1. A shape of the insulation layer 140 will be described below in detail with reference to FIGS. 2A to 2J.

A passivation layer (130 of FIG. 2A or 130a of FIG. 2B) may be disposed between the upper surface of the semiconductor substrate 10 and the insulation layer 140. The passivation layer 130 or 130a may include, for example, an inorganic material such as oxide or nitride. For example, the passivation layer 130 or 130a may include at least one of silicon oxide and silicon nitride. The passivation layer 130 or 130a will be described below in detail with reference to FIGS. 2A and 2B.

An external connection terminal such as a connection bump 160 may be attached on the connection pad 120 and may include a conductive pillar 156 and a conductive cap 158 which covers an upper surface of the conductive pillar 156.

The conductive pillar 156 may include, for example, at least one of Ni, Cu, palladium (Pd), Pt, and Au. The conductive cap 158 may include, for example, at least one of tin (Sn), indium (In), bismuth (Bi), antimony (Sb), Cu, Ag, Au, zinc (Zn), and lead (Pb). An intermediate layer may be provided between the conductive pillar 156 and the conductive cap 158. The intermediate layer may include an intermetal compound which is produced through reaction between a metal material of the conductive pillar 156 and a metal material of the conductive cap 158.

Figure 2A:
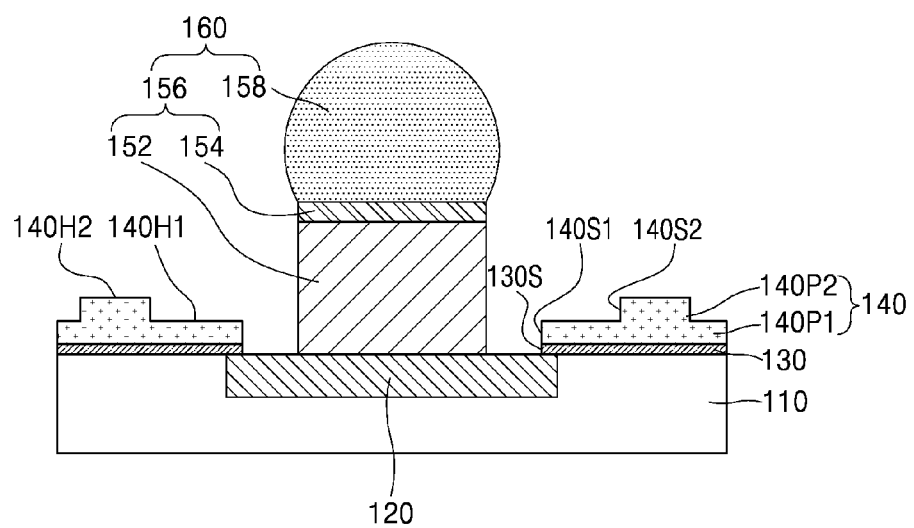
FIGS. 2A to 2J are enlarged cross-sectional views illustrating a connection bump of a semiconductor chip, according to embodiments.
Figure 2B:
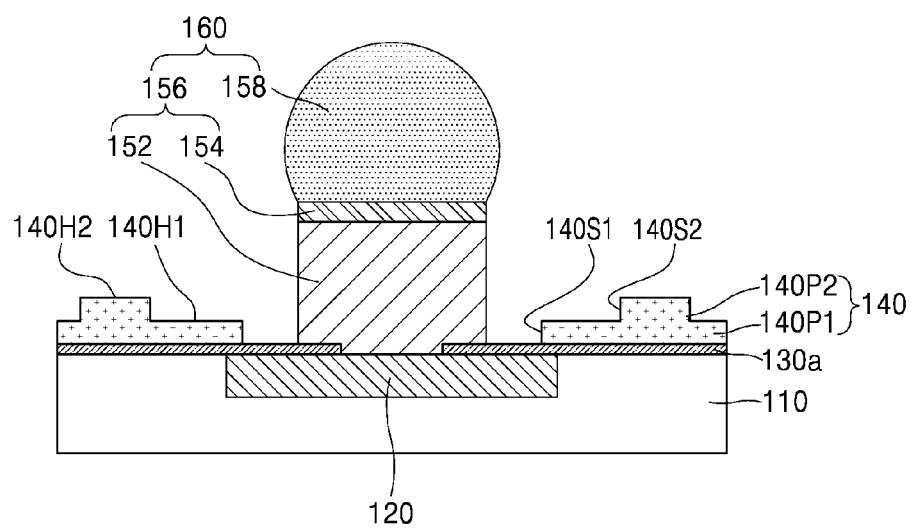

FIGS. 2A to 2J are enlarged cross-sectional views illustrating an external connection terminal of a semiconductor chip according to embodiments. Though FIGS. 2A-2J only show one example external connection terminal, a plurality of connection terminals having the same structure as the examples in these figures may be formed to be spaced apart from each other on a semiconductor substrate of a semiconductor chip such as described herein. Side walls of the insulation layers for these connection terminals may be described as being opposite each other. In detail, FIGS. 2A and 2B are enlarged cross-sectional views illustrating a portion A of FIG. 1, and FIGS. 2C to 2J are enlarged cross-sectional views illustrating a portion corresponding to the portion A of FIG. 1. In descriptions given below with reference to FIGS. 2B to 2J, description overlapping description given with reference to FIGS. 1 and 2A may be omitted.

Referring to FIGS. 1 and 2A, the connection bump 160 may be attached on the connection pad 120 disposed on the active surface which is the upper surface of the semiconductor substrate 110.

The connection bump 160 may include the conductive pillar 156, disposed on the connection pad 120, and the conductive cap 158 which covers the upper surface of the conductive pillar 156. The external connection terminal depicted as connection bump 160 may be a microbump and may be described as a microbump structure.

In some embodiments, the conductive pillar 156 may include a base pillar 152 and a cover pillar 154 which covers an upper surface of the base pillar 152. The base pillar 152 may include, for example, Cu. The cover pillar 154 may include, for example, at least one of Ni, Cu, Pd, Pt, and Au. In some embodiments, the cover pillar 154 may include Ni. In some other embodiments, the cover pillar 154 may have a multi-layer structure which includes a first layer including Ni and a second layer which covers the first layer and includes Cu.

The conductive cap 158 may bond the semiconductor chip 100 to an external device to electrically connect the semiconductor chip 100 to the external device. The conductive cap 158 may include, for example, at least one of Sn, In, Bi, Sb, Cu, Ag, Au, Zn, and Pb, and may have a rounded shape (e.g., a bump or ball shape).

The insulation layer 140 may be disposed on the upper surface of the semiconductor substrate 110. The insulation layer 140 may expose the connection pad 120 and may cover a portion of the upper surface of the semiconductor substrate 110. The insulation layer 140 may be spaced apart from the connection bump 160 and may surround the connection bump 160, from a plan view. The passivation layer 130 may be disposed between the upper surface of the semiconductor substrate 110 and the insulation layer 140.

The insulation layer 140 may include the first horizontal part 140P1 adjacent to the semiconductor substrate 110 and the second horizontal part 140P2 on the first horizontal part 140P1. The first horizontal part 140P1 and the second horizontal part 140P2 may be parts of the insulation layer 140 provided as one body (e.g., an integral structure). The first horizontal part 140P1 may be a part configuring one layer at the lower portion of the insulation layer 140, and the second horizontal part 140P2 may be a part configuring another layer on the first horizontal part 140P1. In FIG. 2A, the insulation layer 140 is illustrated as including the first and second horizontal parts 140P1 and 140P2 configuring two layers, but it is not limited thereto. In other embodiments, the insulation layer 140 may include three or more horizontal parts configuring three or more layers.

A width of the second horizontal part 140P2 in a first, horizontal direction may have a value which is less than a width of the first horizontal part 140P1 in the first direction. The first horizontal part 140P1 and the second horizontal part 140P2 may have a step height therebetween so that the insulation layer 140 is recessed in a direction from an upper surface 140H2 of the second horizontal part 140P2 to an upper surface 140H1 of the first horizontal part 140P1.

The insulation layer 140 may include the first horizontal part 140P1 and the second horizontal part 140P2 which have the step height therebetween and configure different layers.

A side surface 140S1 of the first horizontal part 140P1 and a side surface 140S2 of the second horizontal part 140P2 may each extend in a direction vertical to the upper surface of the semiconductor substrate 110. The side surface 140S1 of the first horizontal part 140P1 and a side surface 130S of the passivation layer 130 may be aligned (e.g., coplanar) in the direction vertical to the upper surface of the semiconductor substrate 110. The side surface 140S2 of the second horizontal part 140P2 may connect the upper surface 140H2 of the second horizontal part 140P2 to the upper surface 140H1 of the first horizontal part 140P1. The upper surface of the conductive pillar 156 may be located on a level, which is higher than an uppermost surface (i.e., the upper surface 140H2 of the second horizontal part 140P2) of the insulation layer 140, in the direction vertical to the upper surface of the semiconductor substrate 110. As shown, a side wall of the insulation layer 140 defining the opening in the insulation layer 140 includes a horizontal step at a level that is recessed relative to a portion of the base pillar 156 that protrudes a maximum distance from the semiconductor substrate 110. A similar feature can be seen in various additional embodiments described below.

The side surface 140S2 of the second horizontal part 140P2 may be farther away from the connection bump 160 than the side surface 140S1 of the first horizontal part 140P1. Therefore, a width between side surfaces 140S of two second horizontal parts 140P2 facing each other with the connection bump 160 therebetween may be greater than a width between side surfaces 140S1 of two first horizontal part 140P1 facing each other with the connection bump 160 therebetween.

In the semiconductor chip 100 according to an embodiment, an interval between the conductive pillar 156 of the connection bump 160 and the insulation layer 140 may have a value which increases as a distance from the semiconductor substrate 110 increases. Therefore, a portion of the adhesive layer 20 is prevented from remaining in a space between the conductive pillar 156 and the insulation layer 140 in a process of separating an adhesive layer (20 of FIGS. 9C to 9G), which fixes the semiconductor chip 100 to a carrier substrate (10 of FIGS. 9C to 9G) in a process of manufacturing the semiconductor chip 100 and/or a process of manufacturing a semiconductor package including the semiconductor chip 100, from the semiconductor chip 100.

Particularly, since the insulation layer 140 includes the first horizontal part 140P1 and the second horizontal part 140P2 which have the step height therebetween and configure different layers, a height of a space, having a relatively narrow width, between the conductive pillar 156 and the side surface 140S1 of the first horizontal part 140P1 may be set relatively less than that of a space between the conductive pillar 156 and the insulation layer 140. Therefore, the insulation layer 140 for protecting the semiconductor substrate 110 may cover a relatively large portion of the upper surface of the semiconductor substrate 110, and moreover, the space between the conductive pillar 156 and the insulation layer 140 may be widely secured, thereby preventing a defect which occurs because a portion of the adhesive layer 20 remains. Accordingly, the reliability of the semiconductor chip 100 is ensured.

Referring to FIG. 2B, a connection bump 160 may be attached on a connection pad 120 disposed on an active surface which is an upper surface of a semiconductor substrate 110. An insulation layer 140 may be disposed on the upper surface of the semiconductor substrate 110. The insulation layer 140 may expose the connection pad 120 and may cover a portion of the upper surface of the semiconductor substrate 110. The insulation layer 140 may be spaced apart from the connection bump 160 and may surround the connection bump 160, from a plan view.

In FIG. 2B, instead of the passivation layer 130 of FIG. 2A, a passivation layer 130a is illustrated. The passivation layer 130a may be disposed between the upper surface of the semiconductor substrate 110 and the insulation layer 140. The passivation layer 130a may extend from a space between the upper surface of the semiconductor substrate 110 and the insulation layer 140 to a space between the connection pad 120 and a conductive pillar 156. The passivation layer 130a may cover a whole portion of the upper surface of the semiconductor substrate 110 except a portion of an upper surface of the connection pad 120. The term "contact" as used herein refers to a direction physical connection, i.e., touching.

The conductive pillar 156 may contact a portion, uncovered by the passivation layer 130a, of the upper surface of the connection pad 120.

The passivation layer 130a may cover a portion, uncovered by the insulation layer 140 and the conductive pillar 156, of the upper surface of the semiconductor substrate 110 and a portion, uncovered by the insulation layer 140 and the conductive pillar 156, of the upper surface of the connection pad 120.

Figure 2C:
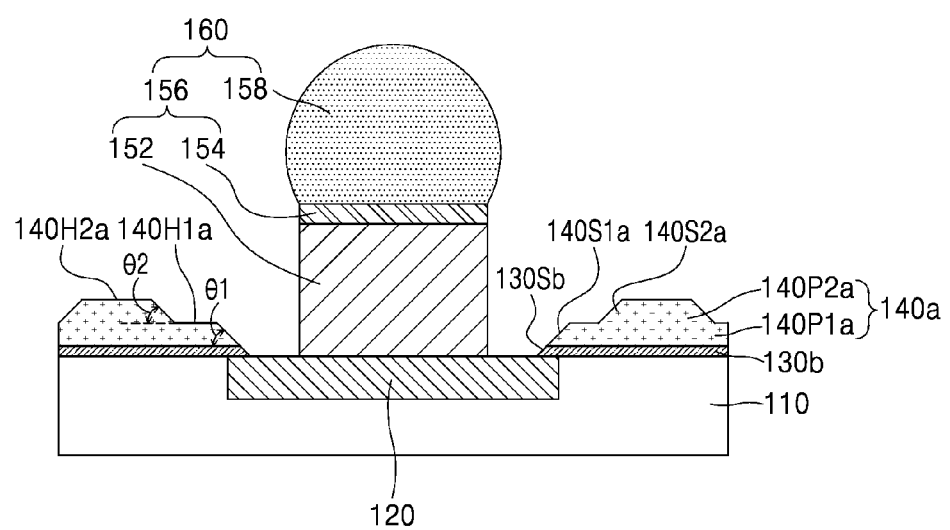

Referring to FIG. 2C, a connection bump 160 may be attached on a connection pad 120 disposed on an active surface which is an upper surface of a semiconductor substrate 110. In FIG. 2C, instead of the passivation layer 130 and the insulation layer 140 of FIG. 2A, a passivation layer 130b and an insulation layer 140a are illustrated.

The insulation layer 140a may be disposed on the upper surface of the semiconductor substrate 110. The insulation layer 140a may expose the connection pad 120 and may cover a portion of the upper surface of the semiconductor substrate 110. The insulation layer 140a may be spaced apart from the connection bump 160 and may surround the connection bump 160, from a plan view. The passivation layer 130b may be disposed between the upper surface of the semiconductor substrate 110 and the insulation layer 140a.

The insulation layer 140a may include a first horizontal part 140P1a, which is a lower portion adjacent to the semiconductor substrate 110, and a second horizontal part 140P2a on the first horizontal part 140P1a. The first horizontal part 140P1a and the second horizontal part 140P2a may be parts of the insulation layer 140a provided as one body (e.g., an integral structure). The first horizontal part 140P1a may be a part configuring one layer at a lower portion of the insulation layer 140a, and the second horizontal part 140P2a may be a part configuring another layer on the first horizontal part 140P1a. In FIG. 2C, the insulation layer 140a is illustrated as including the first and second horizontal parts 140P1a and 140P2a configuring two layers, but is not limited thereto. In other embodiments, the insulation layer 140a may include three or more horizontal parts configuring three or more layers.

An approximate width of the second horizontal part 140P2a, in a first, horizontal direction, may have a value which is less than that of an approximate width of the first horizontal part 140P1a in the first direction. A width in the first direction of each of the first horizontal part 140P1a and the second horizontal part 140P2a may decrease as a distance to the semiconductor substrate 110 increases. An approximate width of the first horizontal part 140P1a may denote an average width of the first horizontal part 140P1a, and an approximate width of the second horizontal part 140P2a may denote an average width of the second horizontal part 140P2a. The first horizontal part 140P1a and the second horizontal part 140P2a may have a step height therebetween so that the insulation layer 140a is recessed in a direction from an upper surface 140H2a of the second horizontal part 140P2a to an upper surface 140H1a of the first horizontal part 140P1a.

The insulation layer 140a may include the first horizontal part 140P1a and the second horizontal part 140P2a which have the step height therebetween and configure different layers. As shown in the embodiment of FIG. 2C, at least part of the passivation layer 130b and the side surface 140S1a of the insulation layer 140a both vertically overlap a portion the connection pad 120.

A side surface 140S1a of the first horizontal part 140P1a and a side surface 140S2a of the second horizontal part 140P2a may each extend so as to be inclined with respect to the upper surface of the semiconductor substrate 110. The side surface 140S1a of the first horizontal part 140P1a may be an inclined surface which extends to have a slope of a first angle θ1 with respect to the upper surface of the semiconductor substrate 110, and the side surface 140S2a of the second horizontal part 140P2a may be an inclined surface which extends to have a slope of a second angle θ2 with respect to the upper surface of the semiconductor substrate 110. The first angle θ1 and the second angle θ2 may each have a value which is within a range between 0 degrees to 90 degrees (e.g., from 1 degree to 89 degrees when the side surface is not vertical). In some embodiments, the first angle θ1 and the second angle θ2 may have the same value. With respect to the conductive pillar 156, each of the side surfaces 140S1a and 140S2a may be described as being inclined downward toward the base pillar 156.

The side surface 140S1a of the first horizontal part 140P1a and a side surface 130Sb of the passivation layer 130b may be aligned in a direction corresponding to the first angle θ1 with respect to the upper surface of the semiconductor substrate 110. The side surface 140S2a of the second horizontal part 140P2a may connect the upper surface 140H2a of the second horizontal part 140P2a to the upper surface 140H1a of the first horizontal part 140P1a. An upper surface of a conductive pillar 156 may be located on a level, which is higher than an uppermost surface (i.e., the upper surface 140H2a of the second horizontal part 140P2a) of the insulation layer 140a, in a direction vertical to the upper surface of the semiconductor substrate 110.

Each of the side surface 140S1a of the first horizontal part 140P1a and the side surface 140S2a of the second horizontal part 140P2a may be an inclined surface extending to a portion which becomes farther away from the connection bump 160 as a distance from the upper surface of the semiconductor substrate 110 increases.

The side surface 140S2a of the second horizontal part 140P2a may be farther away from the connection bump 160 than the side surface 140S1a of the first horizontal part 140P1a. Therefore, a width between side surfaces 140Sa of two second horizontal parts 140P2a facing each other with the connection bump 160 therebetween may be greater than a width between side surfaces 140S1a of two first horizontal parts 140P1a facing each other with the connection bump 160 therebetween.

Figure 2D:
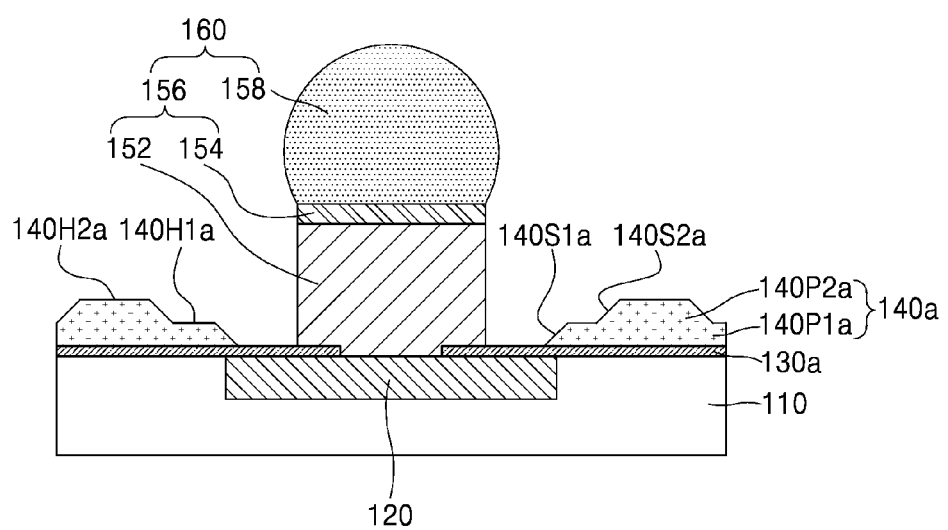

Referring to FIG. 2D, a connection bump 160 may be attached on a connection pad 120 disposed on an active surface which is an upper surface of a semiconductor substrate 110.

An insulation layer 140a may be disposed on the upper surface of the semiconductor substrate 110. The insulation layer 140a may expose the connection pad 120 and may cover a portion of the upper surface of the semiconductor substrate 110. The insulation layer 140a may be spaced apart from the connection bump 160 and may surround the connection bump 160.

In FIG. 2D, instead of the passivation layer 130b of FIG. 2C, a passivation layer 130a is illustrated. The passivation layer 130a may be disposed between the upper surface of the semiconductor substrate 110 and the insulation layer 140a. The passivation layer 130a may extend from a space between the upper surface of the semiconductor substrate 110 and the insulation layer 140a to a space between the connection pad 120 and a conductive pillar 156. The passivation layer 130a may cover a whole portion of the upper surface of the semiconductor substrate 110 except a portion of an upper surface of the connection pad 120.

The conductive pillar 156 may contact a portion, uncovered by the passivation layer 130a, of the upper surface of the connection pad 120.

The passivation layer 130a may cover a portion, uncovered by the insulation layer 140a and the conductive pillar 156, of the upper surface of the semiconductor substrate 110 and a portion, uncovered by the insulation layer 140a and the conductive pillar 156, of the upper surface of the connection pad 120.

Figure 2E:
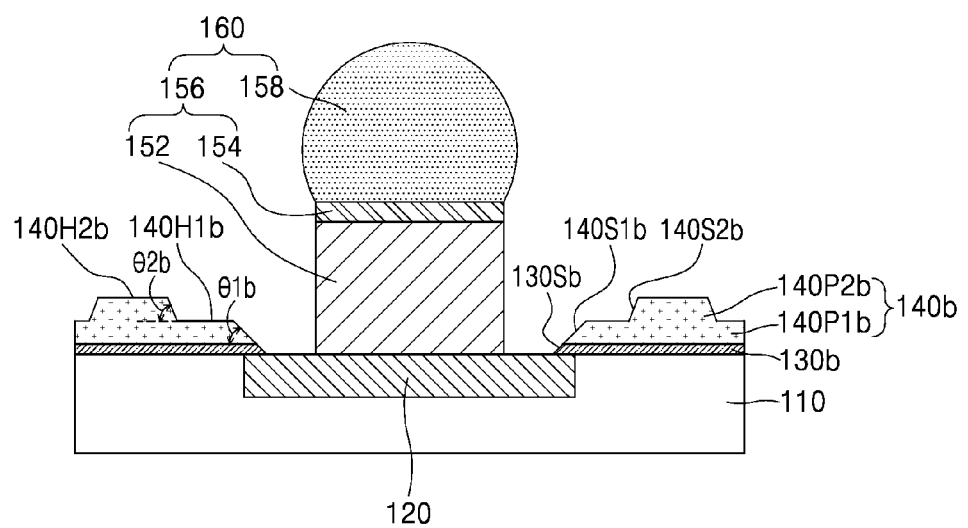

Referring to FIG. 2E, a connection bump 160 may be attached on a connection pad 120 disposed on an active surface which is an upper surface of a semiconductor substrate 110. In FIG. 2E, instead of the passivation layer 130 and the insulation layer 140 of FIG. 2A, a passivation layer 130b and an insulation layer 140b are illustrated.

The insulation layer 140b may be disposed on the upper surface of the semiconductor substrate 110. The insulation layer 140b may expose the connection pad 120 and may cover a portion of the upper surface of the semiconductor substrate 110. The insulation layer 140b may be spaced apart from the connection bump 160 and may surround the connection bump 160.

The passivation layer 130b may be disposed between the upper surface of the semiconductor substrate 110 and the insulation layer 140b.

The insulation layer 140b may include a first horizontal part 140P1b, which is a lower portion adjacent to the semiconductor substrate 110, and a second horizontal part 140P2b on the first horizontal part 140P1b. The first horizontal part 140P1b and the second horizontal part 140P2b may be parts of the insulation layer 140b provided as one body (e.g., an integral structure). The first horizontal part 140P1a may be a part configuring one layer at a lower portion of the insulation layer 140b, and the second horizontal part 140P2b may be a part configuring another layer on the first horizontal part 140P1b. In FIG. 2E, the insulation layer 140b is illustrated as including the first and second horizontal parts 140P1b and 140P2b configuring two layers, but is not limited thereto. In other embodiments, the insulation layer 140b may include three or more horizontal parts configuring three or more layers.

In a first, horizontal direction, an approximate width of the second horizontal part 140P2b may have a value which is less than that of an approximate width of the first horizontal part 140P1b. The first horizontal part 140P1b and the second horizontal part 140P2b may have a step height therebetween so that the insulation layer 140b is recessed in a direction from an upper surface 140H2b of the second horizontal part 140P2b to an upper surface 140H1b of the first horizontal part 140P1b.

The insulation layer 140b may include the first horizontal part 140P1b and the second horizontal part 140P2b which have the step height therebetween and configure different layers.

A side surface 140S1b of the first horizontal part 140P1b and a side surface 140S2b of the second horizontal part 140P2b may each extend so as to be inclined with respect to the upper surface of the semiconductor substrate 110. The side surface 140S1b of the first horizontal part 140P1b may be an inclined surface which extends to have a slope (e.g., a constant slope) of a first angle θ1b with respect to the upper surface of the semiconductor substrate 110, and the side surface 140S2b of the second horizontal part 140P2b may be an inclined surface which extends to have a slope (e.g., a constant slope) of a second angle θ2b with respect to the upper surface of the semiconductor substrate 110. The first angle θ1b and the second angle θ2b may each have a value which is within a range between 0 degrees to 90 degrees (e.g., between 1 degree and 89 degrees). In some embodiments, the first angle θ1b and the second angle θ2b may have different values. For example, the first angle θ1b, and thus the slope of the side surface 140S1b, may have a value which is less than that of the second angle θ2b. In some embodiments (not shown in FIG. 2E), the first angle θ1b may have a value which is greater than that of the second angle θ2b. For example, as shown in FIG. 2E, an angle of inclination of the lower side surface, such as side surface 140S1b, relative to the semiconductor substrate 110 may be less than an angle of inclination of the upper side surface, such as side surface 140S2b, relative to the semiconductor substrate 110. For example, the angle of inclination of the lower side surface with respect to an upper surface of the semiconductor substrate 110 may be in a range between about 40 degrees to about 50 degrees, and the angle of inclination of the upper side surface with respect to an upper surface of the semiconductor substrate 110 may be about 70 degrees, where the angle of inclination refers to the first angle θ1b and second angle θ2b. Though not shown in FIG. 2E, in some embodiments, the angle of inclination of the lower side surface with respect to the upper surface of the semiconductor substrate 110 may be between 65 degrees and 90 degrees, and the angle of inclination of the upper side surface with respect to the upper surface of the semiconductor substrate 110 may be less than the angle of inclination of the upper side surface. The various side surfaces described herein may be referred to as side walls.

In some embodiments, such as in the embodiments of FIG. 2E, a widest space between the side wall (e.g., side surface) of the insulation layer and the base pillar above a horizontal step formed by a lower portion of the insulation layer is about twice a widest space between the side wall of the insulation layer and the base pillar below the horizontal step. Furthermore, in some embodiments, a ratio of a widest space between the side wall of the insulation layer and the base pillar above the horizontal step to a widest space between the side wall of the insulation layer and the base pillar below the horizontal step may be about 5:3. A height of the uppermost portion of the base pillar above the semiconductor substrate may be about 20 μm and a width of the uppermost portion of the base pillar may be about 25 μm. Furthermore, a height of the uppermost portion of the base pillar above the semiconductor substrate divided by a width of the base pillar at the uppermost portion may be greater than about 0.5.

The side surface 140S1b of the first horizontal part 140P1b and a side surface 130Sb of the passivation layer 130b may be aligned in a direction corresponding to the first angle θ1b with respect to the upper surface of the semiconductor substrate 110. The side surface 140S2b of the second horizontal part 140P2b may connect the upper surface 140H2b of the second horizontal part 140P2b to the upper surface 140H1b of the first horizontal part 140P1b. An upper surface of a conductive pillar 156 may be located on a level, which is higher than an uppermost surface (i.e., the upper surface 140H2b of the second horizontal part 140P2b) of the insulation layer 140b, in a direction vertical to the upper surface of the semiconductor substrate 110.

Each of the side surface 140S1b of the first horizontal part 140P1b and the side surface 140S2b of the second horizontal part 140P2b may be an inclined surface extending to a portion which becomes farther away from the connection bump 160 as a distance from the upper surface of the semiconductor substrate 110 increases.

The side surface 140S2b of the second horizontal part 140P2b may be farther away from the connection bump 160 than the side surface 140S1b of the first horizontal part 140P1b. Therefore, a width between side surfaces 140S2b of two second horizontal parts 140P2b facing each other with the connection bump 160 therebetween may be greater than a width between side surfaces 140S1b of two first horizontal part 140P1b facing each other with the connection bump 160 therebetween.

Figure 2F:
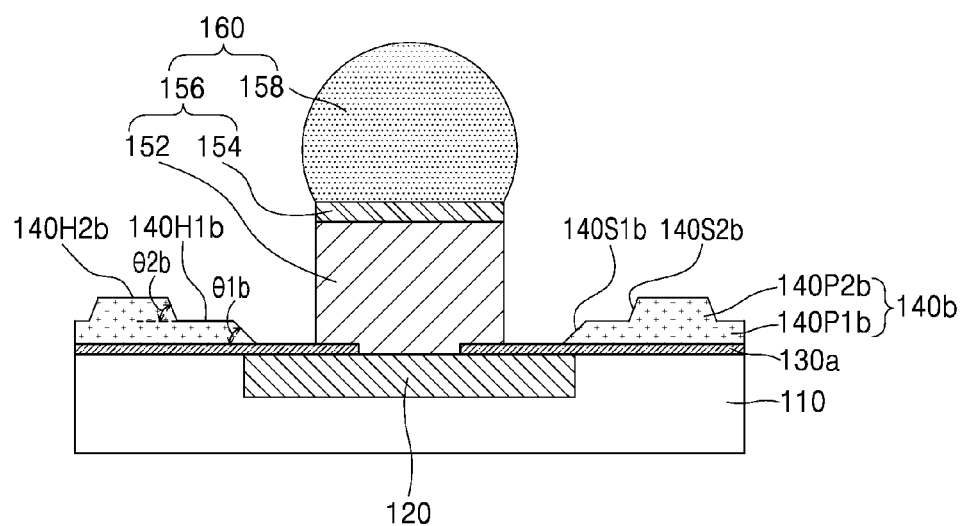

Referring to FIG. 2F, a connection bump 160 may be attached on a connection pad 120 disposed on an active surface which is an upper surface of a semiconductor substrate 110. An insulation layer 140b may be disposed on the upper surface of the semiconductor substrate 110. The insulation layer 140b may expose the connection pad 120 and may cover a portion of the upper surface of the semiconductor substrate 110. The insulation layer 140b may be spaced apart from the connection bump 160 and may surround the connection bump 160.

In FIG. 2F, instead of the passivation layer 130b of FIG. 2E, a passivation layer 130a is illustrated. The passivation layer 130a may be disposed between the upper surface of the semiconductor substrate 110 and the insulation layer 140b. The passivation layer 130a may extend from a space between the upper surface of the semiconductor substrate 110 and the insulation layer 140b to a space between the connection pad 120 and a conductive pillar 156. The passivation layer 130a may cover a whole portion of the upper surface of the semiconductor substrate 110 except a portion of an upper surface of the connection pad 120.

The conductive pillar 156 may contact a portion, uncovered by the passivation layer 130a, of the upper surface of the connection pad 120.

The passivation layer 130a may cover a portion, uncovered by the insulation layer 140b and the conductive pillar 156, of the upper surface of the semiconductor substrate 110 and a portion, uncovered by the insulation layer 140b and the conductive pillar 156, of the upper surface of the connection pad 120.

Figure 2G:
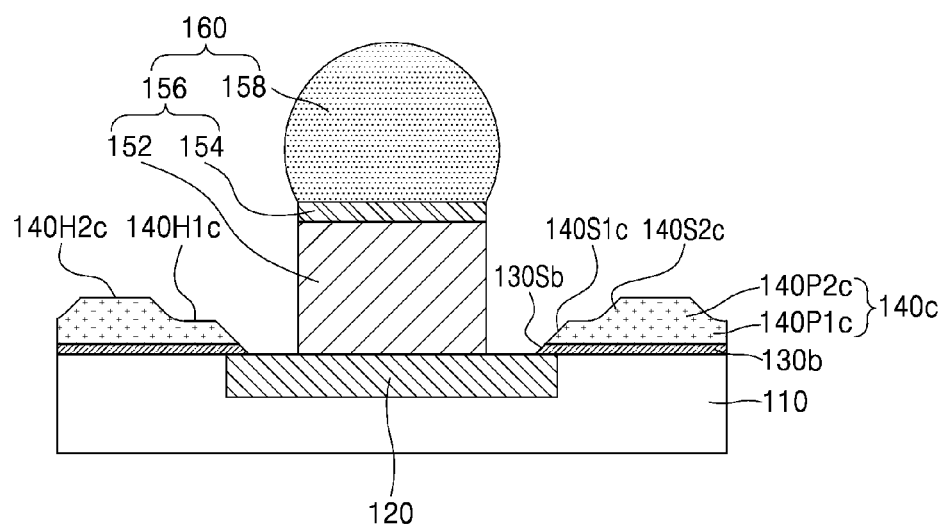

Referring to FIG. 2G, a connection bump 160 may be attached on a connection pad 120 disposed on an active surface which is an upper surface of a semiconductor substrate 110. In FIG. 2G, instead of the passivation layer 130 and the insulation layer 140 of FIG. 2A, a passivation layer 130b and an insulation layer 140c are illustrated.

The insulation layer 140c may be disposed on the upper surface of the semiconductor substrate 110. The insulation layer 140c may expose the connection pad 120 and may cover a portion of the upper surface of the semiconductor substrate 110. The insulation layer 140c may be spaced apart from the connection bump 160 and may surround the connection bump 160.

The passivation layer 130b may be disposed between the upper surface of the semiconductor substrate 110 and the insulation layer 140c.

The insulation layer 140c may include a first horizontal part 140P1c, which is a lower portion adjacent to the semiconductor substrate 110, and a second horizontal part 140P2c on the first horizontal part 140P1c. The first horizontal part 140P1c and the second horizontal part 140P2c may be parts of the insulation layer 140c provided as one body (e.g., an integral structure). The first horizontal part 140P1c may be a part configuring one layer at a lower portion of the insulation layer 140c, and the second horizontal part 140P2c may be a part configuring another layer on the first horizontal part 140P1c. In FIG. 2G, the insulation layer 140c is illustrated as including the first and second horizontal parts 140P1c and 140P2c configuring two layers, but it is not limited thereto. In other embodiments, the insulation layer 140c may include three or more horizontal parts configuring three or more layers.

In a first, horizontal direction, an approximate width of the second horizontal part 140P2c may have a value which is less than that of an approximate width of the first horizontal part 140P1c. The first horizontal part 140P1c and the second horizontal part 140P2c may have a step height therebetween so that the insulation layer 140c is recessed in a direction from an upper surface 140H2c of the second horizontal part 140P2c to an upper surface 140H1c of the first horizontal part 140P1c.

The insulation layer 140c may include the first horizontal part 140P1c and the second horizontal part 140P2c which have the step height therebetween and configure different layers.

A side surface 140S1c of the first horizontal part 140P1c may extend so as to be inclined with respect to the upper surface of the semiconductor substrate 110. The side surface 140S1c of the first horizontal part 140P1c may be an inclined surface which extends to have a slope of a certain angle having a value within a range between 0 degrees and 90 degrees (e.g., from 1 degree to 89 degrees) with respect to the upper surface of the semiconductor substrate 110.

A side surface 140S2c of the second horizontal part 140P2c may be an inclined surface which extends so as to be rounded between the upper surface 140H1c of the first horizontal part 140P1c and the upper surface 140H2c of the second horizontal part 140P2c (thereby having a changing slope for that portion). The side surface 140S2c of the second horizontal part 140P2c may be rounded to have a convex shape which protrudes toward the second horizontal part 140P2. In this manner, a transition from an upper side surface (e.g., 140S2c) of the insulation layer 140c to the horizontal step formed by the upper surface 140H1c and the side surface 140S1c is gradual.

The side surface 140S1c of the first horizontal part 140P1c and a side surface 130Sb of the passivation layer 130b may be aligned in a direction corresponding to a certain angle having a value within a range between 0 degrees and 90 degrees with respect to the upper surface of the semiconductor substrate 110.

An upper surface of a conductive pillar 156 may be located on a level, which is higher than an uppermost surface (i.e., the upper surface 140H2c of the second horizontal part 140P2c) of the insulation layer 140c, in a direction vertical to the upper surface of the semiconductor substrate 110.

Each of the side surface 140S1c of the first horizontal part 140P1c and the side surface 140S2c of the second horizontal part 140P2c may be an inclined surface extending to a portion which becomes farther away from the connection bump 160 as a distance from the upper surface of the semiconductor substrate 110 increases.

The side surface 140S2c of the second horizontal part 140P2c may be farther away from the connection bump 160 than the side surface 140S1c of the first horizontal part 140P1c. Therefore, a width between side surfaces 140S2c of two second horizontal parts 140P2c facing each other with the connection bump 160 therebetween may be greater than a width between side surfaces 140S1c of two first horizontal part 140P1c facing each other with the connection bump 160 therebetween.

Figure 2H:
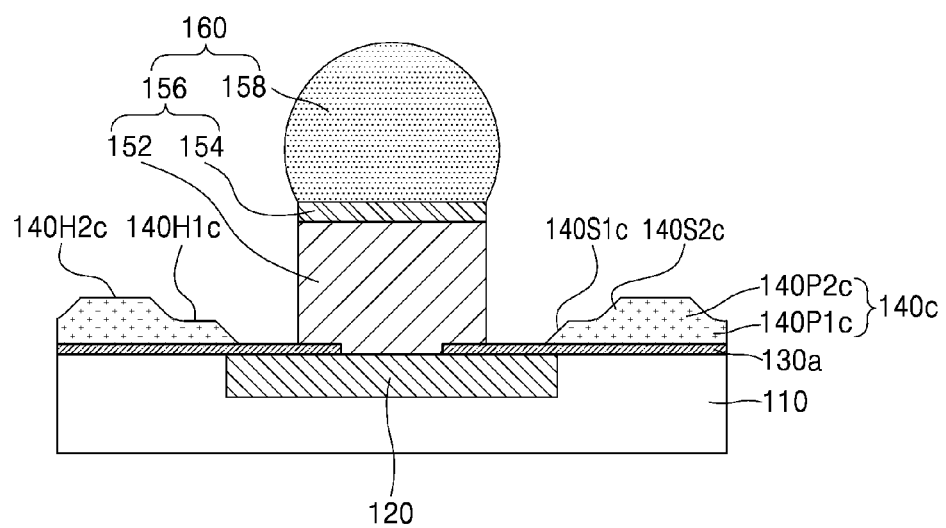

Referring to FIG. 2H, a connection bump 160 may be attached on a connection pad 120 disposed on an active surface which is an upper surface of a semiconductor substrate 110. An insulation layer 140c may be disposed on the upper surface of the semiconductor substrate 110. The insulation layer 140a may expose the connection pad 120 and may cover a portion of the upper surface of the semiconductor substrate 110. The insulation layer 140c may be spaced apart from the connection bump 160 and may surround the connection bump 160.

In FIG. 2H, instead of the passivation layer 130b of FIG. 2G, a passivation layer 130a is illustrated. The passivation layer 130a may be disposed between the upper surface of the semiconductor substrate 110 and the insulation layer 140c. The passivation layer 130a may extend from a space between the upper surface of the semiconductor substrate 110 and the insulation layer 140c to a space between the connection pad 120 and a conductive pillar 156. The passivation layer 130a may cover a whole portion of the upper surface of the semiconductor substrate 110 except a portion of an upper surface of the connection pad 120.

The conductive pillar 156 may contact a portion, uncovered by the passivation layer 130a, of the upper surface of the connection pad 120.

The passivation layer 130a may cover a portion, uncovered by the insulation layer 140c and the conductive pillar 156, of the upper surface of the semiconductor substrate 110 and a portion, uncovered by the insulation layer 140c and the conductive pillar 156, of the upper surface of the connection pad 120.

Figure 2I:
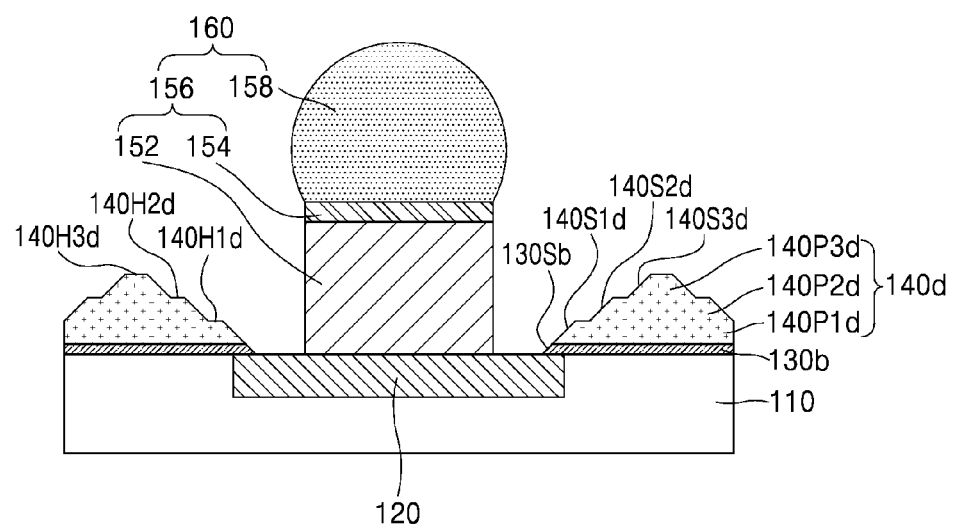

Referring to FIG. 2I, a connection bump 160 may be attached on a connection pad 120 disposed on an active surface which is an upper surface of a semiconductor substrate 110. In FIG. 2I, instead of the insulation layer 140a of FIG. 2C, an insulation layer 140d is illustrated.

The insulation layer 140d may be disposed on the upper surface of the semiconductor substrate 110. The insulation layer 140d may expose the connection pad 120 and may cover a portion of the upper surface of the semiconductor substrate 110. The insulation layer 140d may be spaced apart from the connection bump 160 and may surround the connection bump 160. A passivation layer 130b may be disposed between the upper surface of the semiconductor substrate 110 and the insulation layer 140d.

The insulation layer 140d may include a first horizontal part 140P1d which is a lower portion adjacent to the semiconductor substrate 110, a second horizontal part 140P2d on the first horizontal part 140P1d, and a third horizontal part 140P3d on the second horizontal part 140P2d. The first horizontal part 140P1d, the second horizontal part 140P2d, and the third horizontal part 140P3d may be parts of the insulation layer 140d provided as one body (e.g., an integral structure). The first horizontal part 140P1d may be a part configuring one layer at a lower portion of the insulation layer 140d, the third horizontal part 140P3d may be a part configuring one layer at an upper portion of the insulation layer 140d, and the second horizontal part 140P2d may be a part configuring another layer between the first horizontal part 140P1d and the third horizontal part 140P3d. In FIG. 2I, the insulation layer 140d is illustrated as including the first horizontal part 140P1d, the second horizontal part 140P2d, and the third horizontal part 140P3d which configure three layers, but is not limited thereto. In other embodiments, the insulation layer 140d may include four or more horizontal parts configuring four or more layers.

An approximate width of the third horizontal part 140P3d may have a value which is less than that of an approximate width of the second horizontal part 140P2d, and an approximate width of the second horizontal part 140P2d may have a value which is less than that of an approximate width of the first horizontal part 140P1d. The second horizontal part 140P2d and the third horizontal part 140P3d may have a step height therebetween so that the insulation layer 140d is recessed in a direction from an upper surface 140H3d of the third horizontal part 140P3d to an upper surface 140H2d of the second horizontal part 140P2d, and the first horizontal part 140P1d and the second horizontal part 140P2d may have a step height therebetween so that the insulation layer 140d is recessed in a direction from the upper surface 140H2d of the second horizontal part 140P2d to an upper surface 140H1d of the first horizontal part 140P1d.

The insulation layer 140d may include the first horizontal part 140P1d, the second horizontal part 140P2d, and the third horizontal part 140P3d which have the step height therebetween and configure different layers.

A side surface 140S1d of the first horizontal part 140P1d, a side surface 140S2d of the second horizontal part 140P2d, and a side surface 140S3d of the third horizontal part 140P3d may each extend so as to be inclined with respect to the upper surface of the semiconductor substrate 110. In some embodiments, the side surface 140S1d of the first horizontal part 140P1d, the side surface 140S2d of the second horizontal part 140P2d, and the side surface 140S3d of the third horizontal part 140P3d may be inclined surfaces which extend to have a slope of the same angle having a value within a range between 0 degrees and 90 degrees with respect to the upper surface of the semiconductor substrate 110. In some other embodiments, the side surface 140S1d of the first horizontal part 140P1d, the side surface 140S2d of the second horizontal part 140P2d, and the side surface 140S3d of the third horizontal part 140P3d may be inclined surfaces which extend to have a slope of an angle having a value within a range between 0 degrees and 90 degrees with respect to the upper surface of the semiconductor substrate 110, and in this case, at least one of the inclined surfaces may extend to have a slope of another angle. In some other embodiments, the side surface 140S1d of the first horizontal part 140P1d, the side surface 140S2d of the second horizontal part 140P2d, and the side surface 140S3d of the third horizontal part 140P3d may extend in a direction vertical to the upper surface of the semiconductor substrate 110.

The side surface 140S1d of the first horizontal part 140P1d and a side surface 130Sb of the passivation layer 130b may be aligned in a direction corresponding to the same angle with respect to the upper surface of the semiconductor substrate 110. In some embodiments, the side surface 140S1d of the first horizontal part 140P1d and the side surface 130Sb of the passivation layer 130b may be aligned in a direction corresponding to the same angle within a range between 0 degrees and 90 degrees with respect to the upper surface of the semiconductor substrate 110. In some other embodiments, the side surface 140S1d of the first horizontal part 140P1d and the side surface 130Sb of the passivation layer 130b may be aligned in a direction vertical to the upper surface of the semiconductor substrate 110.

The side surface 140S2d of the second horizontal part 140P2d may connect the upper surface 140H2d of the second horizontal part 140P2d to the upper surface 140H1d of the first horizontal part 140P1d, and the side surface 140S3d of the third horizontal part 140P3d may connect the upper surface 140H3d of the third horizontal part 140P3d to the upper surface 140H2d of the second horizontal part 140P2d. An upper surface of a conductive pillar 156 may be located on a level, which is higher than an uppermost surface (i.e., the upper surface 140H3d of the third horizontal part 140P3d) of the insulation layer 140d, in a direction vertical to the upper surface of the semiconductor substrate 110.

Each of the side surface 140S1d of the first horizontal part 140P1d, the side surface 140S2d of the second horizontal part 140P2d, and the side surface 140S3d of the third horizontal part 140P3d may be an inclined surface extending to a portion which becomes farther away from the connection bump 160 as a distance from the upper surface of the semiconductor substrate 110 increases.

The side surface 140S2d of the third horizontal part 140P3d may be farther away from the connection bump 160 than the side surface 140S2d of the second horizontal part 140P2d, and the side surface 140S2d of the second horizontal part 140P2d may be farther away from the connection bump 160 than the side surface 140S1d of the first horizontal part 140P1d. Therefore, a width between side surfaces 140S3d of two third horizontal parts 140P3d facing each other with the connection bump 160 therebetween may be greater than a width between side surfaces 140S2d of two second horizontal part 140P2d facing each other with the connection bump 160 therebetween, and a width between side surfaces 140S2d of two second horizontal parts 140P2d facing each other with the connection bump 160 therebetween may be greater than a width between side surfaces 140S1d of two first horizontal part 140P1d facing each other with the connection bump 160 therebetween.

Figure 2J:
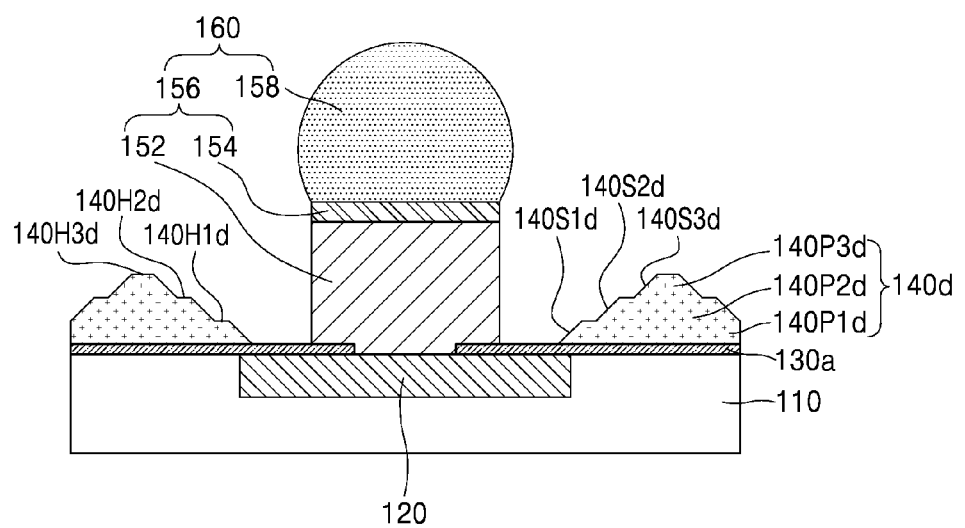
Figure 3A:
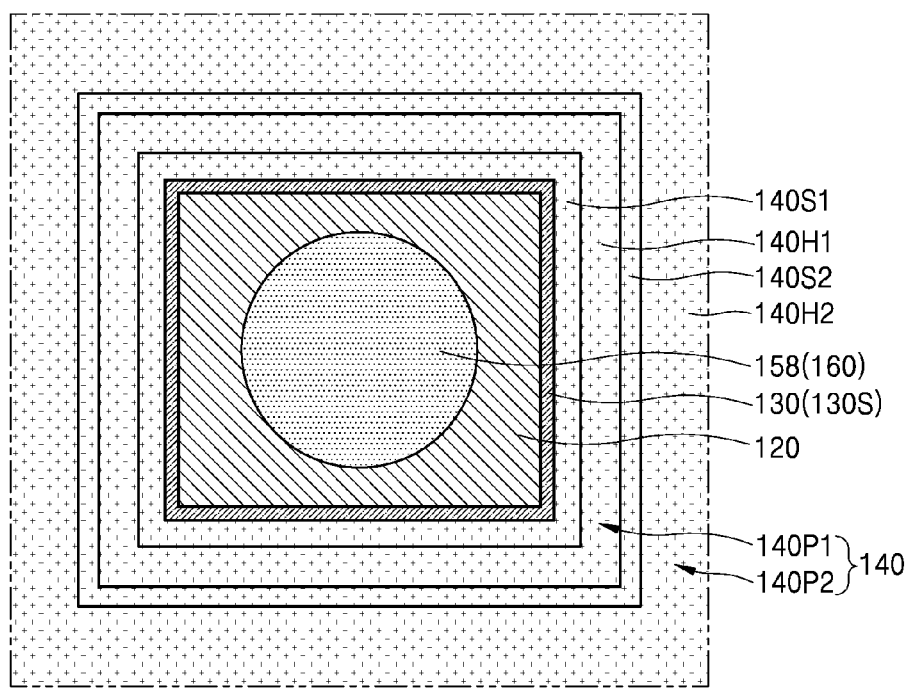
FIGS. 3A to 3D are enlarged plan views illustrating a connection bump of a semiconductor chip, according to embodiments.
Figure 3B:
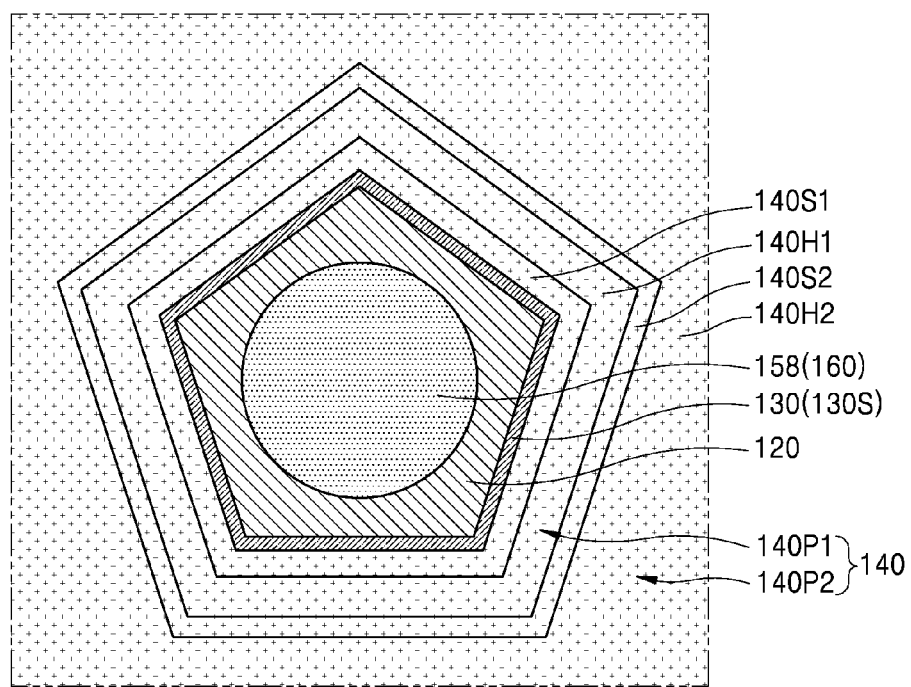
Figure 3C:
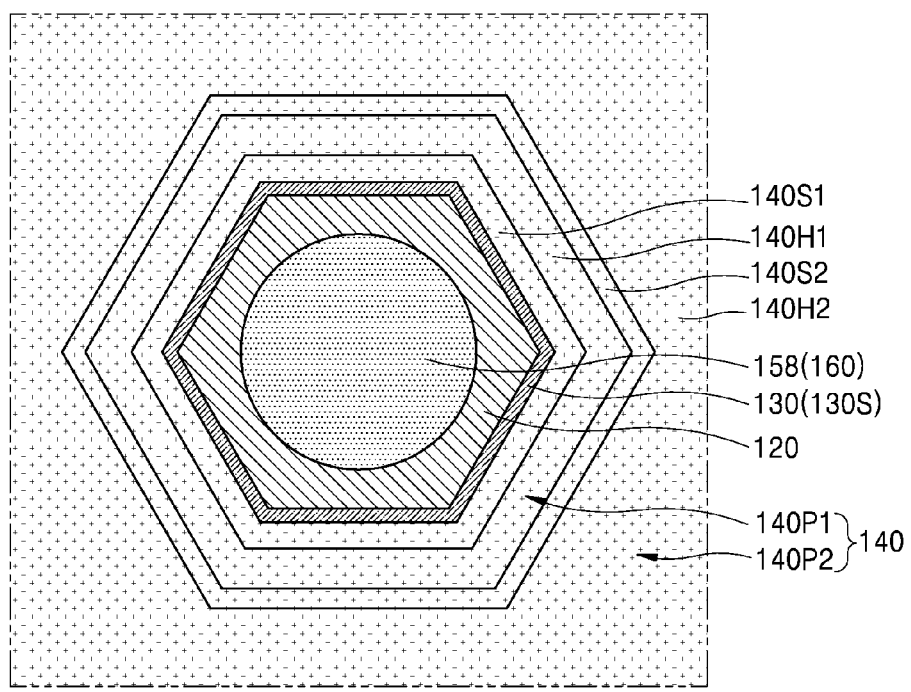
Figure 3D:
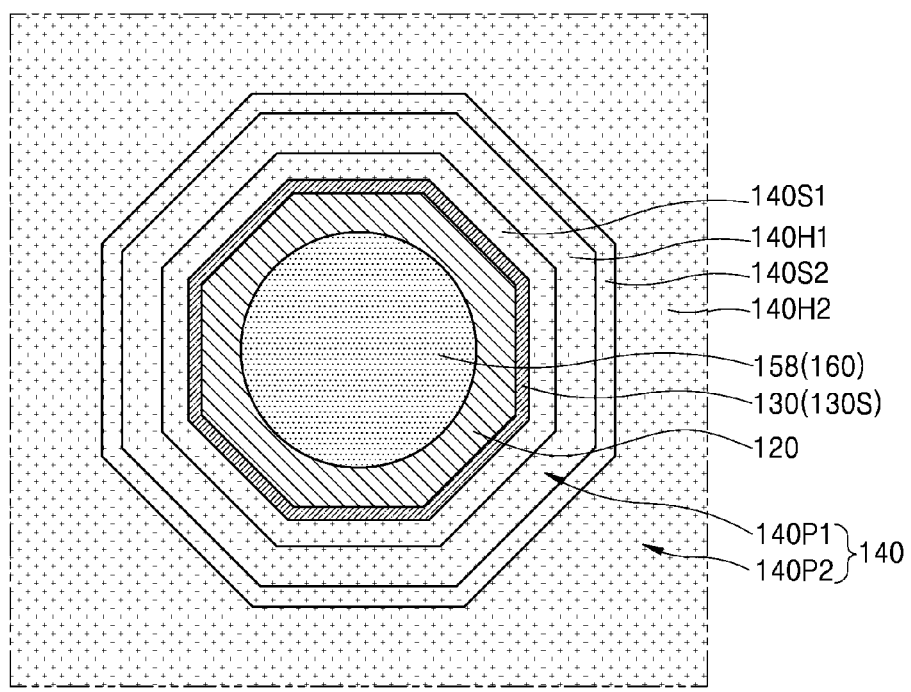

Referring to FIG. 2J, a connection bump 160 may be attached on a connection pad 120 disposed on an active surface which is an upper surface of a semiconductor substrate 110. An insulation layer 140d may be disposed on the upper surface of the semiconductor substrate 110. The insulation layer 140d may expose the connection pad 120 and may cover a portion of the upper surface of the semiconductor substrate 110. The insulation layer 140d may be spaced apart from the connection bump 160 and may surround the connection bump 160.

In FIG. 2J, instead of the passivation layer 130b of FIG. 2I, a passivation layer 130a is illustrated. The passivation layer 130a may be disposed between the upper surface of the semiconductor substrate 110 and the insulation layer 140d. The passivation layer 130a may extend from a space between the upper surface of the semiconductor substrate 110 and the insulation layer 140d to a space between the connection pad 120 and a conductive pillar 156. The passivation layer 130a may cover a whole portion of the upper surface of the semiconductor substrate 110 except a portion of an upper surface of the connection pad 120.

The conductive pillar 156 may contact a portion, uncovered by the passivation layer 130a, of the upper surface of the connection pad 120.

The passivation layer 130a may cover a portion, uncovered by the insulation layer 140d and the conductive pillar 156, of the upper surface of the semiconductor substrate 110 and a portion, uncovered by the insulation layer 140d and the conductive pillar 156, of the upper surface of the connection pad 120.

FIGS. 3A to 3D are enlarged plan views illustrating a connection bump of a semiconductor chip according to embodiments.

Referring to FIGS. 3A to 3D, a passivation layer 130 and an insulation layer 140 may be spaced apart from a connection bump 160 attached on a connection pad 120 and may surround the connection bump 160. In FIGS. 3A to 3D, a conductive cap 158 disposed on an uppermost end of the connection bump 160 is illustrated.

A side surface 140S1 of a first horizontal part 140P1 and a side surface 140S2 of a second horizontal part 140P2 may extend as a rectilinear line in a horizontal direction of an upper surface of a semiconductor substrate (110 of FIGS. 1 and 2A) and may surround the connection bump 160.

In FIGS. 3A to 3D, it is illustrated that each of the side surface 140S1 of the first horizontal part 140P1 and the side surface 140S2 of the second horizontal part 140P2 is provided to have a tetragonal shape, a pentagonal shape, a hexagonal shape, or an octagonal shape in the horizontal direction of the upper surface of the semiconductor substrate 110 and surrounds the connection bump 160, but the present embodiment is not limited thereto.

For example, each of the side surface 140S1 of the first horizontal part 140P1 and the side surface 140S2 of the second horizontal part 140P2 may have an n-angular shape (n≥4) and may surround the connection bump 160.

Figure 4:
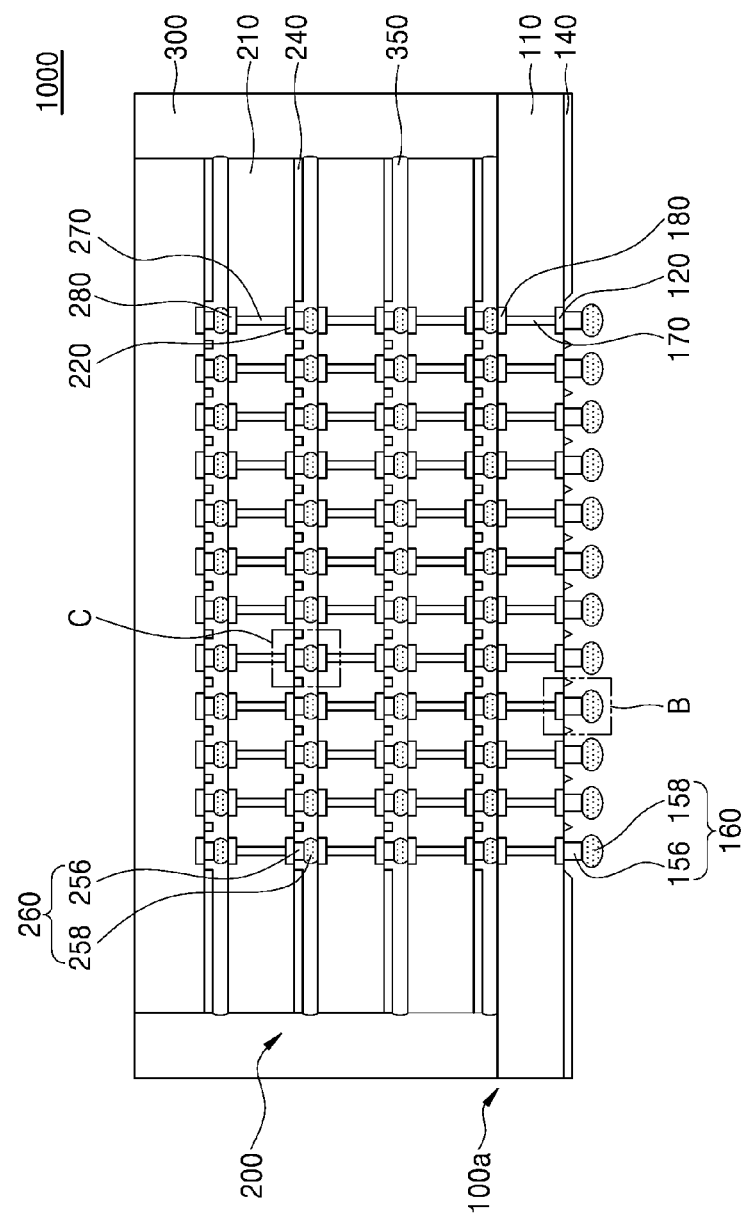
FIG. 4 is cross-sectional view illustrating a semiconductor package including a semiconductor chip, according to an embodiment.

FIG. 4 is cross-sectional view illustrating a semiconductor package 1000 including a semiconductor chip according to an embodiment.

Referring to FIG. 4, the semiconductor package 1000 may include a plurality of semiconductor chips. The plurality of semiconductor chips may include a first semiconductor chip 100a and a plurality of second semiconductor chips 200.

In some embodiments, the first semiconductor chip 100a may be a buffer chip including a serial-parallel conversion circuit, and the plurality of second semiconductor chips 200 may each be a high bandwidth memory dynamic random access memory (HBM DRAM) semiconductor chip.

The first semiconductor chip 100a may generally have a structure similar to that of the semiconductor chip 100 of FIG. 1. The first semiconductor chip 100a may include a first semiconductor substrate 110, a first connection pad 120, a first insulation layer 140, and a first connection bump 160 including a first conductive pillar 156 and a first conductive cap 158. The first semiconductor substrate 110, the first connection pad 120, the first insulation layer 140, and the first connection bump 160 including the first conductive pillar 156 and the first conductive cap 158 are substantially the same elements as the semiconductor substrate 110, the connection pad 120, the insulation layer 140, and the connection bump 160 including the first conductive pillar 156 and the first conductive cap 158 illustrated in FIG. 1, and thus, their detailed descriptions are omitted.

The first semiconductor chip 100a may further include a first through electrode 170 and a first connection pad 180. The first through electrode 170 may electrically connect the first connection pad 120 to the first connection pad 180. The first connection pad 120 and the first connection pad 180 may be respectively disposed on an active surface and an inactive surface of the first semiconductor substrate 110.

The first through electrode 170 may include a conductive plug passing through the first semiconductor substrate 110 and a conductive barrier layer surrounding the conductive plug. The conductive plug may have a cylindrical shape, and the conductive barrier layer may have a cylindrical shape surrounding a sidewall of the conductive plug. The conductive plug may include Cu, CuSn, CuMg, CuNi, CuZn, CuPd, CuAu, CuRe, CuW, W, or a W alloy, but is not limited thereto. The conductive plug may include, for example, one or more of Al, Au, beryllium (Be), Bi, cobalt (Co), Cu, hafnium (Hf), In, manganese (Mn), molybdenum (Mo), Ni, Pb, Pd, Pt, rhodium (Rh), rhenium (Re), ruthenium (Ru), tantalum (Ta), tellurium (Te), titanium (Ti), W, Zn, and zirconium (Zr) and may include one or more stacked structures. The conductive barrier layer may include, for example, at least one material selected from among W, WN, WC, Ti, TiN, Ta, TaN, Ru, Co, Mn, WN, Ni, and NiB, but is not limited thereto.

A via insulation layer may be provided between the first semiconductor substrate 110 and the first through electrode 170 and may surround a sidewall of the first through electrode 170. The via insulation layer may include oxide, nitride, carbide, a polymer, or a combination thereof. The via insulation layer may include, for example, ozone/tetra-ethyl ortho-silicate (O₃/TEOS)-based high aspect ratio process (HARP) oxide.

In FIG. 4, an example where the first through electrode 170 directly connects the first connection pad 120 to the second connection pad 180 is illustrated, but the present embodiment is not limited thereto. In other embodiments, the first through electrode 170 may be provided to have one of a via-first structure, a via-middle structure, and a via-last structure.

The plurality of second semiconductor chips 200 may be stacked on the first semiconductor chip 100a.

The plurality of second semiconductor chips 200 may each include a second semiconductor substrate 210, a second top connection pad 220, a second insulation layer 240, and a second connection bump 260 including a second conductive pillar 256 and a second conductive cap 258.

Each of the plurality of second semiconductor chips 200 may further include a second through electrode 270 and a second connection pad 280. In some embodiments, an uppermost-end second semiconductor chip 200 of the plurality of second semiconductor chips 200 may not include the second through electrode 270 and the second connection pad 280.

The second semiconductor substrate 210, the second top connection pad 220, the second insulation layer 240, the second connection bump 260 including the second conductive pillar 256 and the second conductive cap 258, the second through electrode 270, and the second connection pad 280 are substantially similar to the first semiconductor substrate 110, the first connection pad 120, the first insulation layer 140, the first connection bump 160 including the first conductive pillar 156 and the first conductive cap 158, the first through electrode 170, and the first connection pad 180. Hereinafter, therefore, overlapping descriptions are omitted, and a difference will be mainly described.

A second semiconductor chip 200, disposed in an upper portion, of the plurality of second semiconductor chips 200 may be electrically connected to the first semiconductor chip 100a through a second through electrode 270 included in a lower second semiconductor chip 200.

An insulation adhesive layer 350 may be provided between the first semiconductor chip 100a and each of the plurality of second semiconductor chips 200. The insulation adhesive layer 350 may include a non-conductive film (NCF) or a non-conductive paste (NCP). Alternatively, the insulation adhesive layer 350 may include an underfill material such as an insulating polymer or epoxy resin.

The semiconductor package 1000 may include a molding layer 300 which is provided on the first semiconductor chip 100a to surround a side surface of each of the plurality of second semiconductor chips 200 and a side surface of the insulation adhesive layer 350. The molding layer 300 may include, for example, an epoxy mold compound (EMC).

A plurality of first connection bumps 160 included in the first semiconductor chip 100a may be arranged at a first pitch, and a plurality of second connection bumps 260 included in each of the plurality of second semiconductor chips 200 may be arranged at a second pitch. In some embodiments, the first pitch and the second pitch have the same value.

As described herein, the term "semiconductor device" is used to refer to either a semiconductor chip, such as described in connection with FIG. 1, or a semiconductor package, such as described in connection with FIGS. 4 and 10.

Figure 5A:
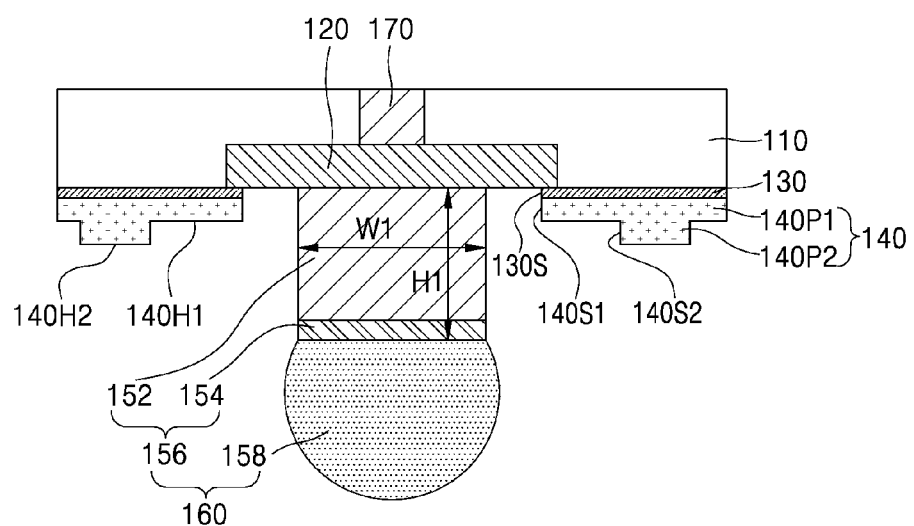
FIGS. 5A and 5B are enlarged cross-sectional views illustrating a connection bump of a semiconductor chip included in a semiconductor package, according to an embodiment.
Figure 5B:
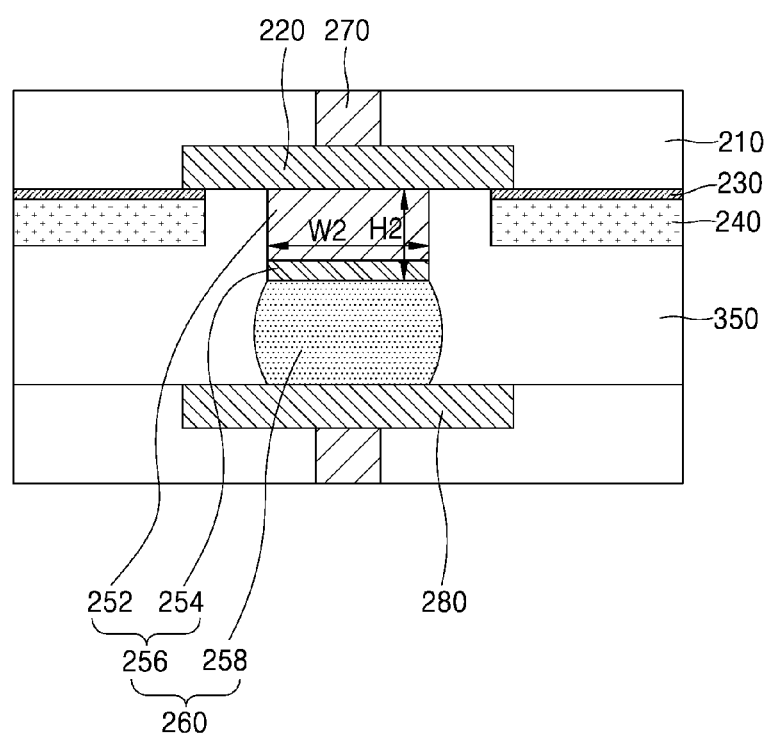

FIGS. 5A and 5B are enlarged cross-sectional views illustrating connection bumps of semiconductor chips included in a semiconductor package according to an embodiment. In detail, FIGS. 5A and 5B are enlarged cross-sectional views illustrating a portion B and a portion C of FIG. 4.

Referring to FIGS. 5A, 5B, and 4, a first semiconductor chip 100a may include a first passivation layer 130, a first insulation layer 140, a first conductive pillar 156, a first conductive cap 158, and a first connection bump 160. The first semiconductor chip 100a may include a first semiconductor substrate 110, a first connection pad 120, the first insulation layer 140, and the first connection bump 160 including the first conductive pillar 156 and the first conductive cap 158. A second semiconductor chip 200 may include a second passivation layer 230, a second insulation layer 240, and a second connection bump 260 including a second conductive pillar 256 and a second conductive cap 258. The first passivation layer 130 is substantially the same element as the passivation layer 130 of FIG. 1, and the second passivation layer 230 is substantially similar to the first passivation layer 130.

The first conductive pillar 156 may include a first base pillar 152 and a first cover pillar 154 covering an upper surface of the first base pillar 152. The second conductive pillar 256 may include a second base pillar 252 and a second cover pillar 254 covering an upper surface of the second base pillar 252. The first base pillar 152 is substantially the same element as the base pillar 152 of FIG. 1, and the second base pillar 252 is similar to the first base pillar 152. The first cover pillar 154 is substantially the same element as the cover pillar 154 of FIG. 1, and the second cover pillar 254 is similar to the first cover pillar 154. Hereinafter, therefore, overlapping descriptions are omitted, and a difference will be mainly described.

The first insulation layer 140 may include a first horizontal part 140P1 adjacent to the first semiconductor substrate 110 and a second horizontal part 140P2 on the first horizontal part 140P1. The first horizontal part 140P1 and the second horizontal part 140P2 may be parts of the first insulation layer 140 provided as one body (e.g., an integral structure). The first horizontal part 140P1 and the second horizontal part 140P2 may have a step height therebetween. That is, the first insulation layer 140 may include the first horizontal part 140P1 and the second horizontal part 140P2 which have the step height therebetween and configure different layers. In other words, the first insulation layer 140 may include two or more horizontal parts configuring two or more layers having a step height therebetween.

The second insulation layer 240 may be configured with only one layer. For example, the second insulation layer 240 may have a single-layer structure which is configured with one layer so as not to have a step height.

The first conductive pillar 156 may have a first width W1 and a first height H1, and the second conductive pillar 256 may have a second width W2 and a second height H2.

The first width W1 may have a value which is greater than that of the second width W2, and the first height H1 may have a value which is greater than that of the second height H2. For example, the first width W1 may be 15 μm to 40 μm, and the second width W2 may be 10 μm to 30 μm within a range less than the first width W1. For example, the first height H1 may be 10 μm to 30 μm, and the second height H2 may be 2 μm to 15 μm within a range less than the first height H1.

The first height H1 to the first width W1 (i.e., an aspect ratio of the first conductive pillar 156) may have a value which is greater than the second height H2 to the second width W2 (i.e., an aspect ratio of the second conductive pillar 256). For example, the aspect ratio of the first conductive pillar 156 may be 0.5 to 1.5, and the aspect ratio of the second conductive pillar 256 may be 0.1 to 1 within a range less than the aspect ratio of the first conductive pillar 156. The aspect ratio of the first conductive pillar 156 may be between 1.5 and 5 times the aspect ratio of the second conductive pillar 256.

A process of manufacturing the first semiconductor chip 100a, a process of manufacturing the second semiconductor chip 200, and a process of manufacturing the semiconductor package 1000 including the first semiconductor chip 100a and the second semiconductor chip 200 may include a process of fixing the first semiconductor chip 100a and/or the second semiconductor chip 200 to a carrier substrate by using an adhesive layer, and then, removing the carrier substrate and the adhesive layer from the first semiconductor chip 100a and/or the second semiconductor chip 200.

In such a process, when the aspect ratio of the first conductive pillar 156 is greater than that of the second conductive pillar 256, there may be a high possibility that a portion of the adhesive layer remains between the first conductive pillar 156 and the first insulation layer 140 of the first semiconductor chip 100a. However, the semiconductor package 1000 according to the present embodiment may have a single-layer structure where the first insulation layer 140 of the first semiconductor chip 100a has a step height, and thus, a space between the first connection bump 160 and the first insulation layer 140 may be secured, thereby preventing a portion of the adhesive layer from remaining between the first connection bump 160 and the first insulation layer 140.

Figure 6A:
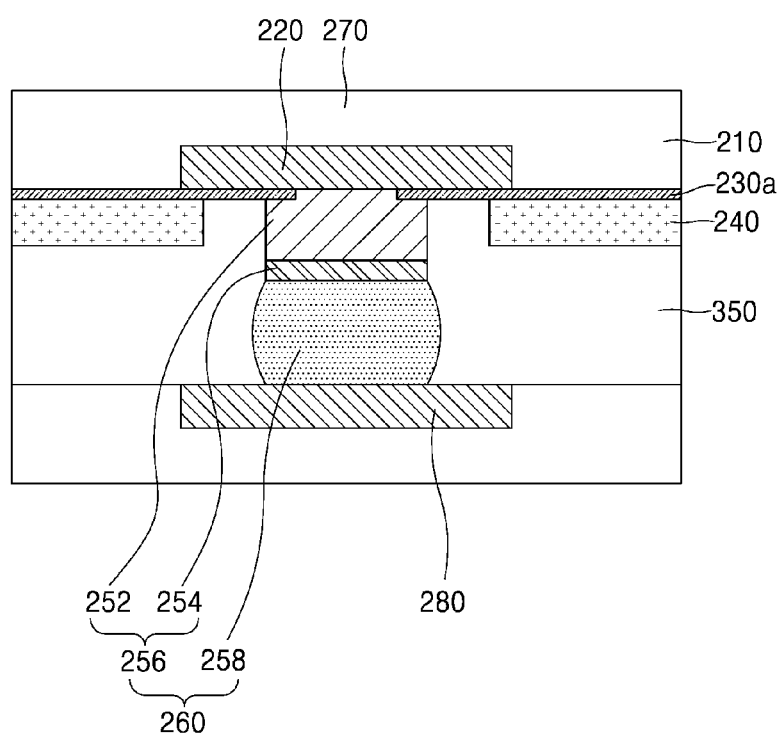
FIGS. 6A to 6C are enlarged cross-sectional views illustrating a connection bump of a semiconductor chip, according to embodiments.
Figure 6B:
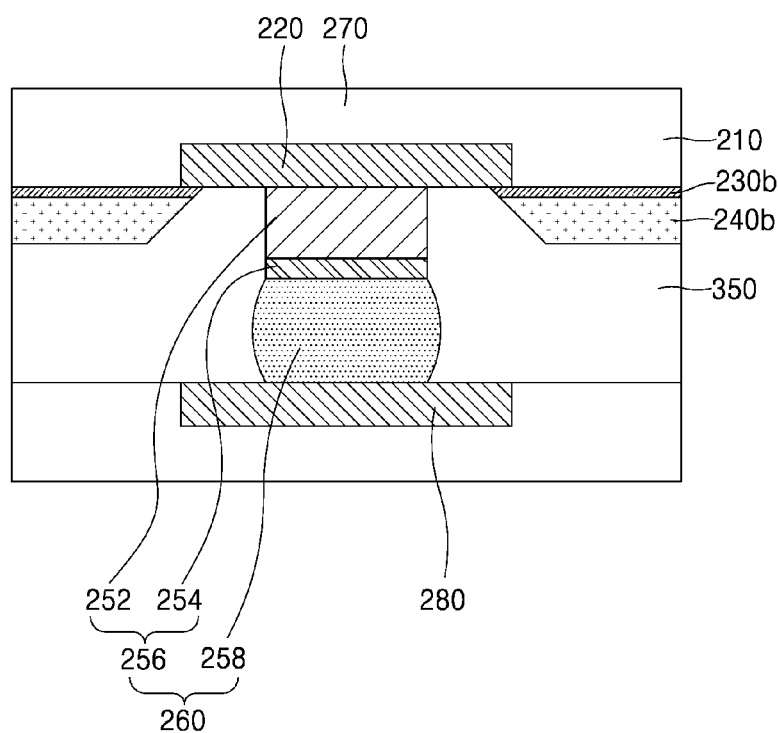
Figure 6C:
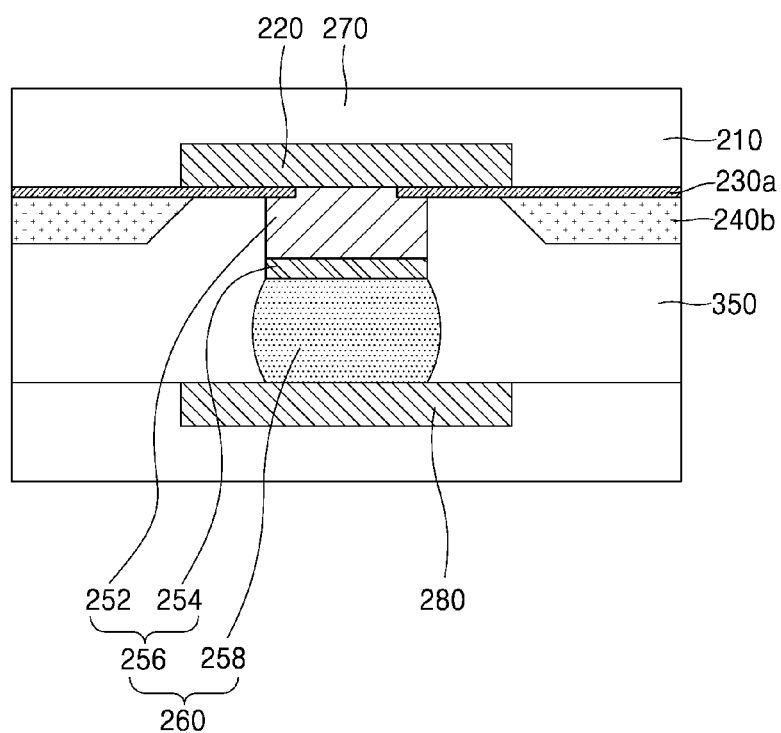

FIGS. 6A to 6C are enlarged cross-sectional views illustrating a connection bump of a semiconductor chip according to embodiments. In detail, FIGS. 6A to 6C are enlarged cross-sectional views of portions corresponding to the portion C of FIG. 4.

Referring to FIG. 6A, a second passivation layer 230a may be disposed between an upper surface of a second semiconductor substrate 210 and a second insulation layer 240. In FIG. 6A, instead of the second passivation layer 230 of FIG. 5B, the second passivation layer 230a is illustrated. The second passivation layer 230a may extend from a space between the upper surface of the second semiconductor substrate 210 and the second insulation layer 240 to a space between a second connection pad 220 and a second conductive pillar 256. The second passivation layer 230a may cover a whole portion of the upper surface of the second semiconductor substrate 210 except a portion of an upper surface of the second connection pad 220.

The second conductive pillar 256 may contact a portion, uncovered by the second passivation layer 230a, of the upper surface of the second connection pad 220. The second passivation layer 230a may cover a portion, uncovered by the second insulation layer 240 and the second conductive pillar 256, of the upper surface of the second semiconductor substrate 210 and a portion, uncovered by the second insulation layer 240 and the second conductive pillar 256, of the upper surface of the second connection pad 220.

Referring to FIG. 6B, a second insulation layer 240b may be disposed on an upper surface of a second semiconductor substrate 210. The second insulation layer 240b may expose a second connection pad 220 and may cover a portion of the upper surface of the second semiconductor substrate 210. A second passivation layer 230b may be disposed between the upper surface of the second semiconductor substrate 210 and the second insulation layer 240b.

In FIG. 6B, instead of the second passivation layer 230 and the second insulation layer 240 of FIG. 5B, the second passivation layer 230b and the second insulation layer 240b are illustrated.

A side surface of each of the second passivation layer 230b and the second insulation layer 240b may extend so as to be inclined with respect to the upper surface of the second semiconductor substrate 210.

Referring to FIG. 6C, a second passivation layer 230a may be disposed between an upper surface of a second semiconductor substrate 210 and a second insulation layer 240b. In FIG. 6C, instead of the second passivation layer 230b of FIG. 6B, the second passivation layer 230a is illustrated. The second passivation layer 230a may extend from a space between the upper surface of the second semiconductor substrate 210 and the second insulation layer 240b to a space between a second connection pad 220 and a second conductive pillar 256. The second passivation layer 230a may cover a whole portion of the upper surface of the second semiconductor substrate 210 except a portion of an upper surface of the second connection pad 220.

The second conductive pillar 256 may contact a portion, uncovered by the second passivation layer 230a, of the upper surface of the second connection pad 220. The second passivation layer 230a may cover a portion, uncovered by the second insulation layer 240b and the second conductive pillar 256, of the upper surface of the second semiconductor substrate 210 and a portion, uncovered by the second insulation layer 240b and the second conductive pillar 256, of the upper surface of the second connection pad 220.

Moreover, although not shown, in some embodiments, the first passivation layer 130 and the first insulation layer 140 included in the first semiconductor chip 100a in FIGS. 4 and 5A may be replaced by the first passivation layer 130a or 130b and the first insulation layer 140a, 140b, 140c, or 140d illustrated in FIGS. 2B to 2J.

Figure 7A:
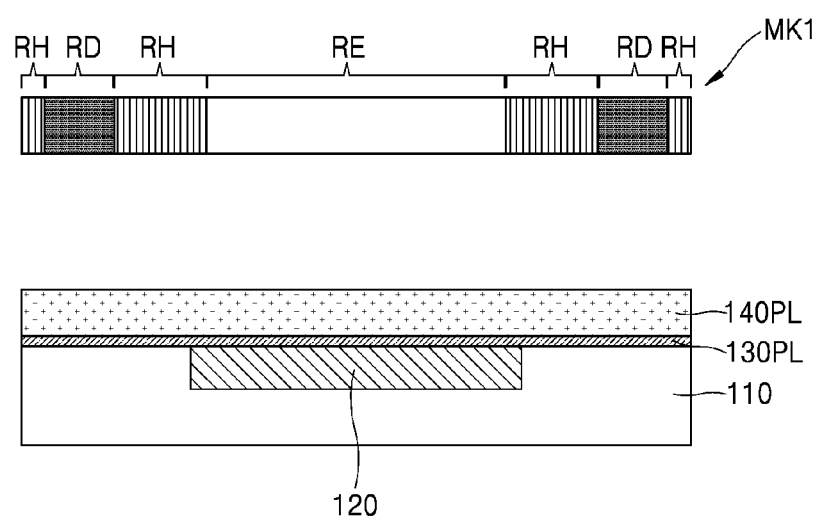
FIGS. 7A to 7C are cross-sectional views sequentially illustrating a method of manufacturing a semiconductor chip, according to an embodiment.
Figure 7B:
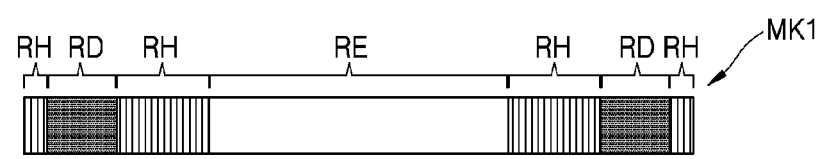
Figure 7B:
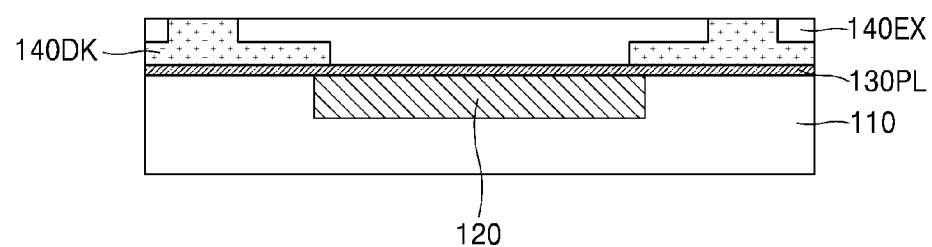
Figure 7C:
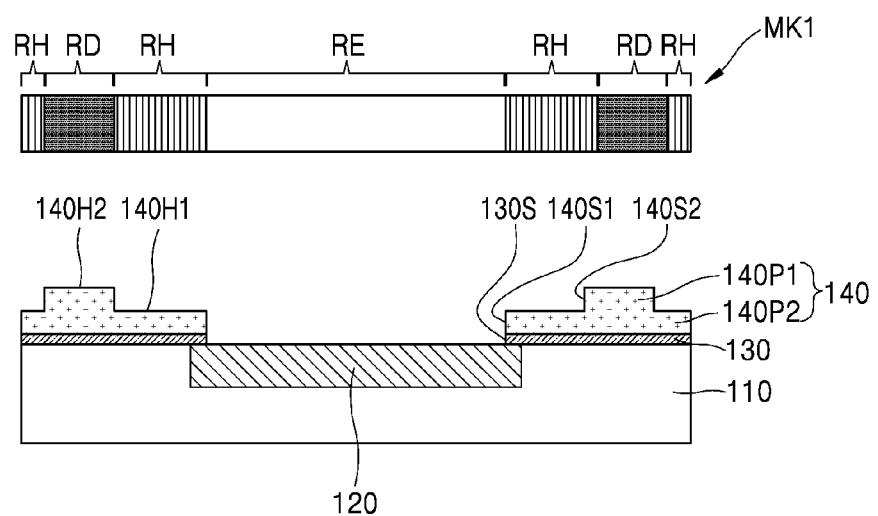

FIGS. 7A to 7C are cross-sectional views sequentially illustrating a method of manufacturing a semiconductor chip, according to an embodiment. In detail, FIGS. 7A to 7C are cross-sectional views sequentially illustrating a method of manufacturing the semiconductor chip 100 illustrated in FIG. 2A.

Referring to FIG. 7A, a preliminary passivation layer 130PL and a preliminary insulation layer 140PL may be sequentially formed on a semiconductor substrate 110 including a connection pad 120. The preliminary passivation layer 130PL may include, for example, an inorganic material such as oxide or nitride. The preliminary insulation layer 140PL may include, for example, PSPI.

Subsequently, a mask MK1 which includes a light transmitting part RE, a light blocking part RD, and a bar pattern part RH may be provided on the semiconductor substrate 110. The light transmitting part RE may transmit light irradiated from an exposure apparatus applied to a photolithography process, and the light blocking part RD may block the irradiated light. The bar pattern part RH may include a plurality of scattering bar patterns which are repeatedly arranged. The bar pattern part RB may transmit only a portion of the light irradiated from the exposure apparatus applied to the photolithography process and may block the other light.

The plurality of scattering bar patterns provided in the bar pattern part RH may have a shape which is one-dimensionally and sequentially surrounded by a plurality of n (n≥4) angles. In the plurality of scattering bar patterns, each part may extend in a rectilinear shape, and a part extending in a curve shape may not be provided.

Referring to FIG. 7B, a portion of the preliminary insulation layer (140PL of FIG. 7A) may be exposed by irradiating light onto the semiconductor substrate 110 through the mask MK1.

A portion, corresponding to the light transmitting part RE of the mask MK1, of the preliminary insulation layer 140PL is fully exposed, and all of a portion corresponding to the light blocking part RD is not exposed. Also, only a portion of an upper portion of a portion, corresponding to the bar pattern part RH, of the preliminary insulation layer 140PL is exposed.

Therefore, the preliminary insulation layer 140PL illustrated in FIG. 7A may include a first part 140EX, exposed by the photolithography process using the mask MK1, and a second part 140DK which is not exposed.

Referring to FIG. 7C, an insulation layer 140 including a first horizontal part 140P1 and a second horizontal part 140P2 provided as one body may be formed by removing the first part 140EX so that the second part 140DK illustrated in FIG. 7B remains. In a process of removing the first part 140EX, a portion of the preliminary passivation layer (130PL of FIG. 7A) may be removed together, and thus, a passivation layer 130 may be formed between the semiconductor substrate 110 and the insulation layer 140.

Figure 8A:
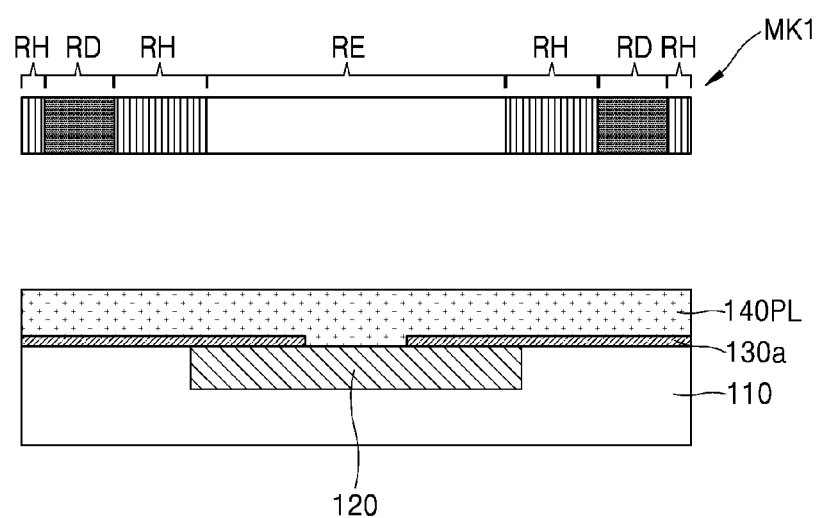
FIGS. 8A to 8C are cross-sectional views sequentially illustrating a method of manufacturing a semiconductor chip, according to an embodiment.
Figure 8B:
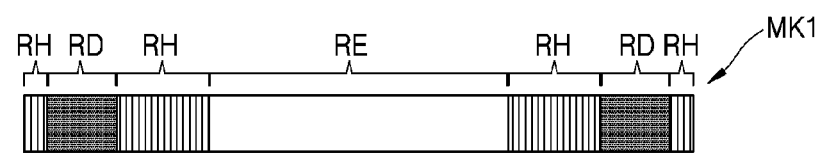
Figure 8B:
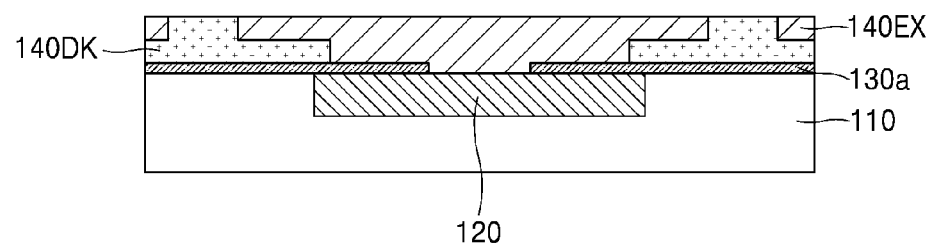
Figure 8C:
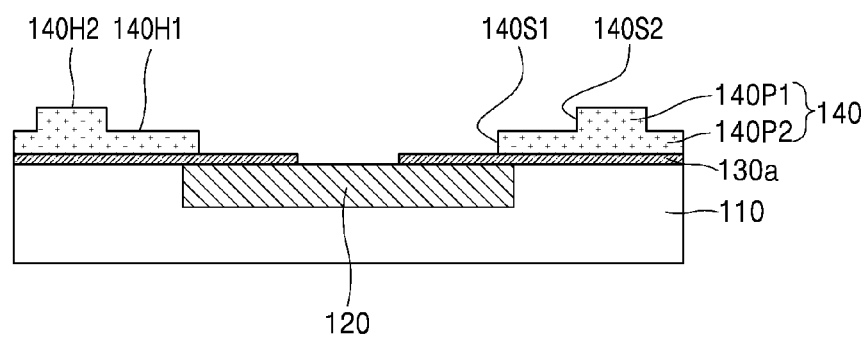

FIGS. 8A to 8C are cross-sectional views sequentially illustrating a method of manufacturing a semiconductor chip, according to an embodiment. In detail, FIGS. 8A to 8C are cross-sectional views sequentially illustrating a method of manufacturing the semiconductor chip illustrated in FIG. 2B.

Referring to FIG. 8A, a passivation layer 130a which does not cover a portion of a connection pad 120 may be formed on a semiconductor substrate 110 including the connection pad 120. The passivation layer 130a may be formed by removing a portion of the preliminary passivation layer 130PL (see FIG. 7A) disposed on the connection pad 120 after the preliminary passivation layer 130PL is formed. Subsequently, a preliminary insulation layer 140PL covering the semiconductor substrate 110 on which the passivation layer 130a is formed may be formed.

Referring to FIGS. 8B and 8C, similar to the illustrations of FIGS. 7B and 7C, the preliminary insulation layer (140PL of FIG. 8A) may be divided into an exposed first part 140EX and an unexposed second part 140DK through a photolithography process using a mask MK1. Subsequently, an insulation layer 140 including a first horizontal part 140P1 and a second horizontal part 140P2 provided as one body may be formed by removing the first part 140EX so that the second part 140DK remains. When the passivation layer 130a has an etching resistance to a process of removing the first part 140EX, a portion of the passivation layer 130a is not removed in the process of removing the first part 140EX.

FIGS. 9A to 9G are cross-sectional views sequentially illustrating a method of manufacturing a semiconductor package, according to an embodiment.

Figure 9A:
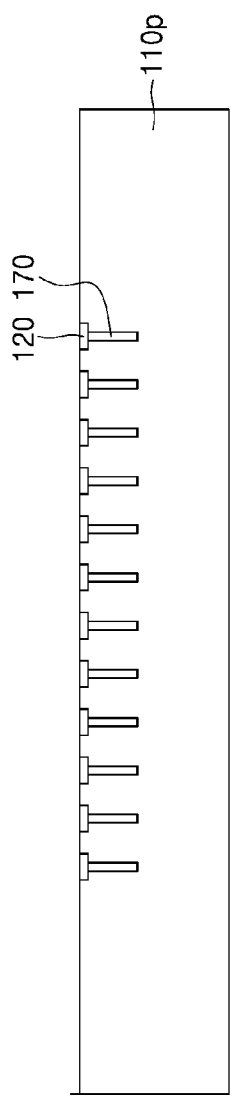
FIGS. 9A to 9G are cross-sectional views sequentially illustrating a method of manufacturing a semiconductor package, according to an embodiment.

Referring to FIG. 9A, a first preliminary semiconductor substrate 110p on which a first connection pad 120 and a first through electrode 170 are formed are provided.

Figure 9B:
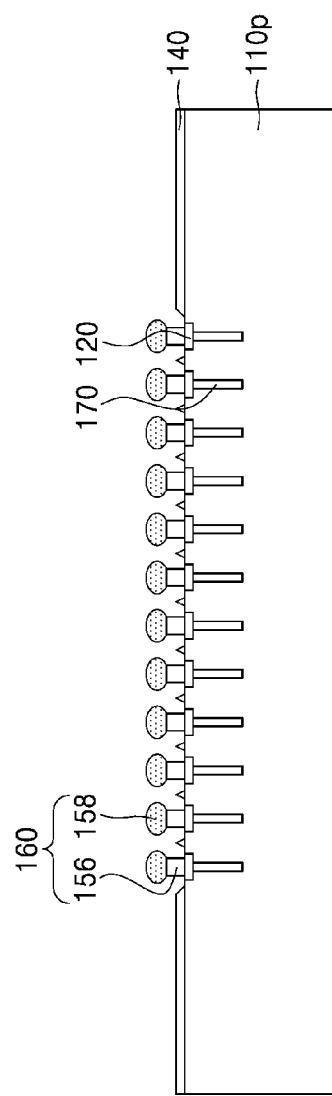

Referring to FIG. 9B, a first insulation layer 140 which exposes the first connection pad 120 without covering the first connection pad 120 are formed on an upper surface of the first preliminary semiconductor substrate 110p. Although not shown, a first passivation layer (130 of FIG. 7C or 130a of FIG. 8C) may be disposed between the first preliminary semiconductor substrate 110p and the first insulation layer 140. The first passivation layer 130 or 130a and the first insulation layer 140 may be formed by a method described above with reference to FIGS. 7A to 7C or FIGS. 8A to 8C.

Subsequently, a first connection bump 160 including a first conductive pillar 156 and a first conductive cap 158 are formed on the first connection pad 120.

Figure 9C:
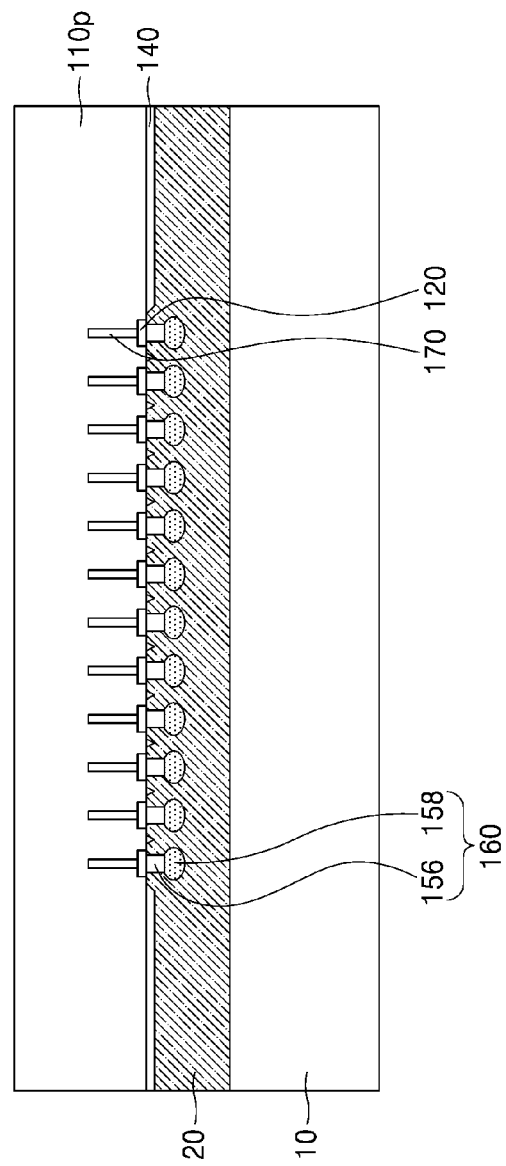

Referring to FIG. 9C, in order for the first connection bump 160 to face a carrier substrate 10, the first preliminary semiconductor substrate 110p is attached on the carrier substrate 10 with an adhesive layer 20 therebetween. The adhesive layer 20 may fill a space between the first insulation layer 140 and the first connection bump 160 and may surround the first connection bump 160.

Figure 9D:
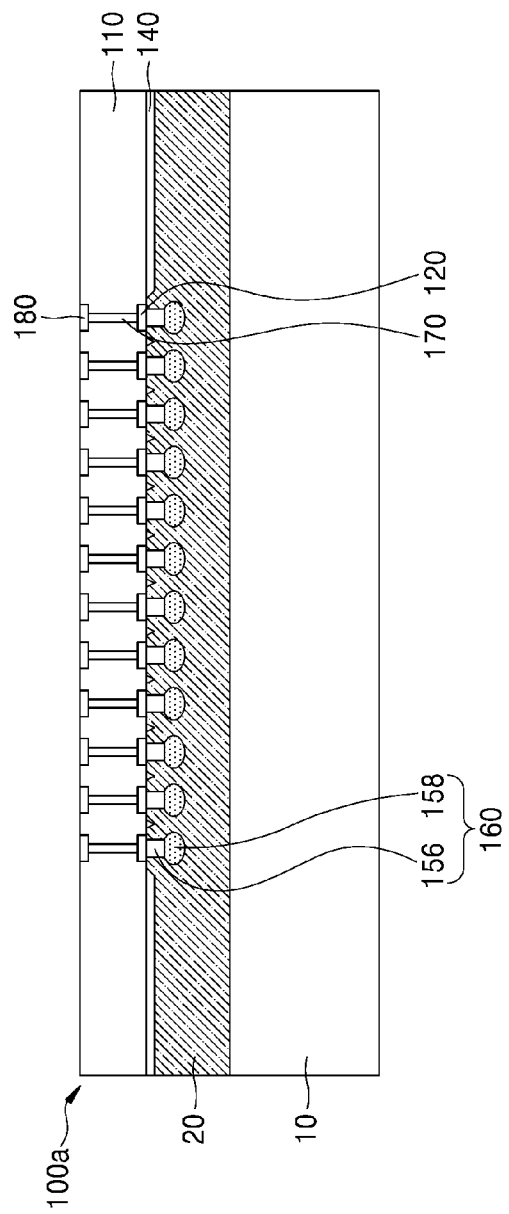

Referring to FIG. 9D, a first semiconductor substrate 110 including a lower surface at which the first through electrode 170 is exposed by removing a portion of a lower surface of the first preliminary semiconductor substrate (110p of FIG. 9B). Subsequently, a first connection pad 180 connected to the first through electrode 170 is formed on the lower surface of the first semiconductor substrate 110, thereby finishing a first semiconductor chip 100a.

Figure 9E:
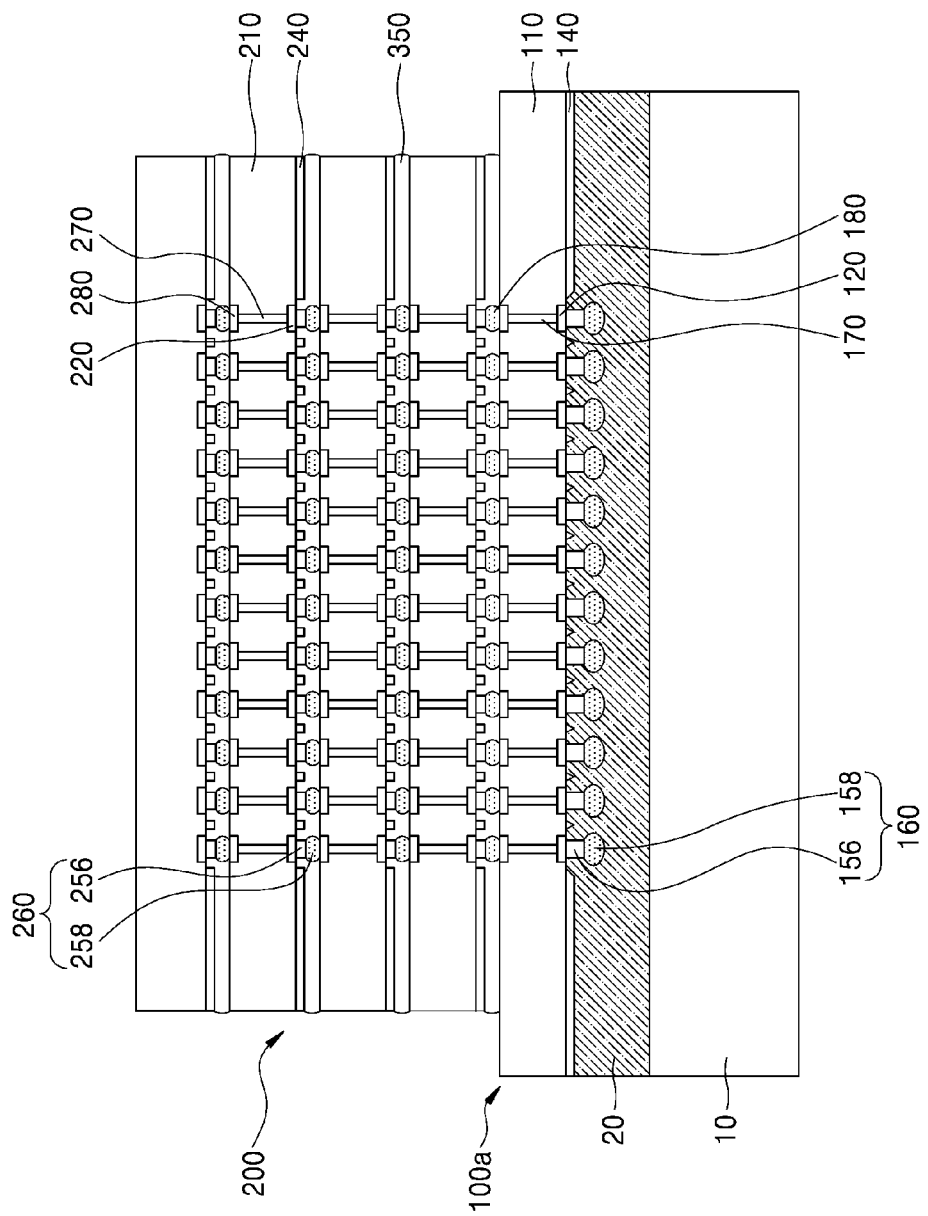

Referring to FIG. 9E, a plurality of second semiconductor chips 200 are stacked on the first semiconductor chip 100a. Each of the plurality of second semiconductor chips 200 may be stacked on the first semiconductor chip 100a by an insulation adhesive layer 350.

Figure 9F:
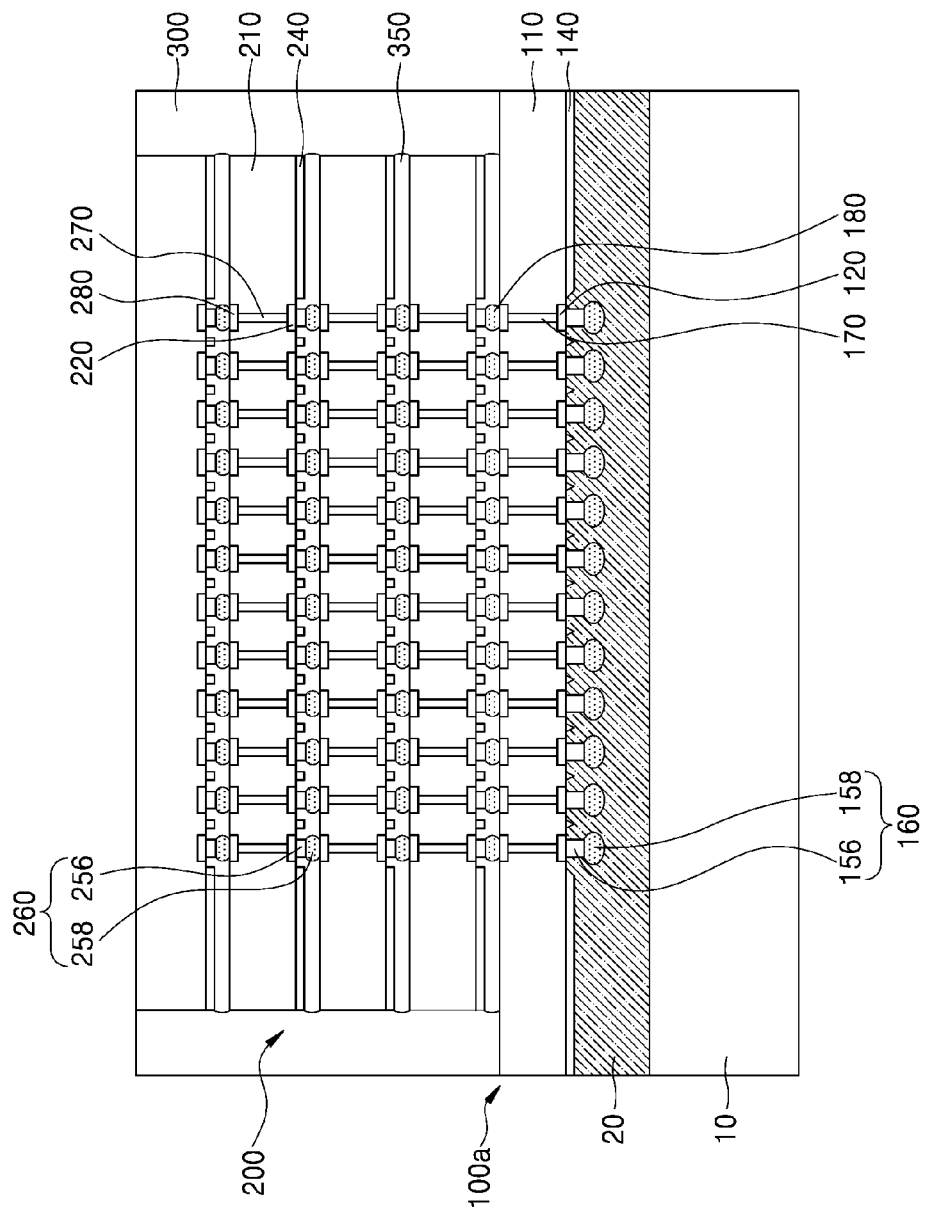

Referring to FIG. 9F, a molding layer 300 which surrounds a side surface of each of the plurality of second semiconductor chips 200 and a side surface of the insulation adhesive layer 350 is formed on the first semiconductor chip 100a.

Figure 9G:
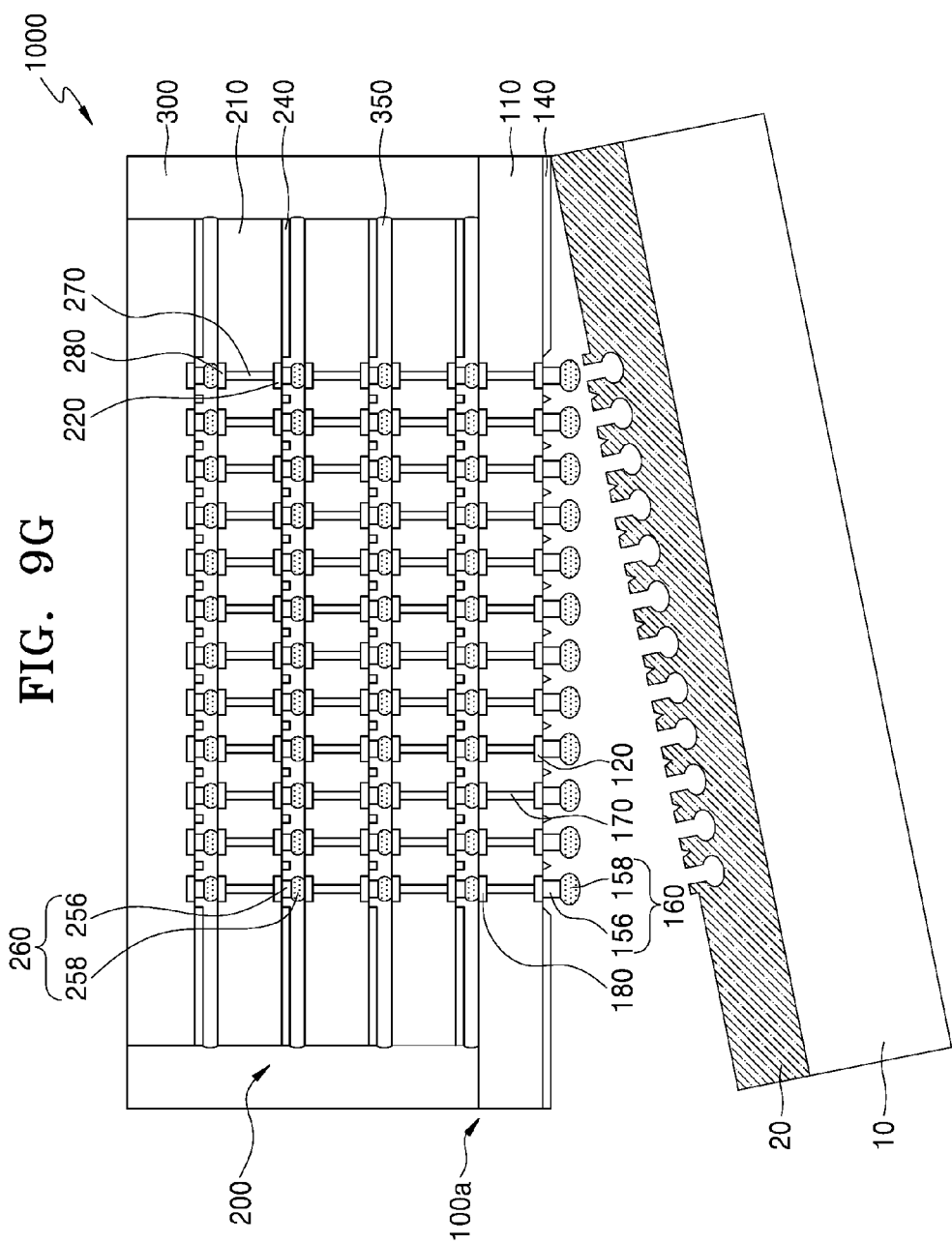

Referring to FIG. 9G, a semiconductor package 1000 is formed by removing the carrier substrate 10 and the adhesive layer 20 from the first semiconductor chip 100a.

As described above, the first insulation layer 140 of the first semiconductor chip 100a may have a multi-layer structure having a step height, and thus, a space between the first connection bump 160 and the first insulation layer 140 may be sufficiently secured, thereby preventing a portion of the adhesive layer 20 from remaining between the first connection bump 160 and the first insulation layer 140.

Figure 10:
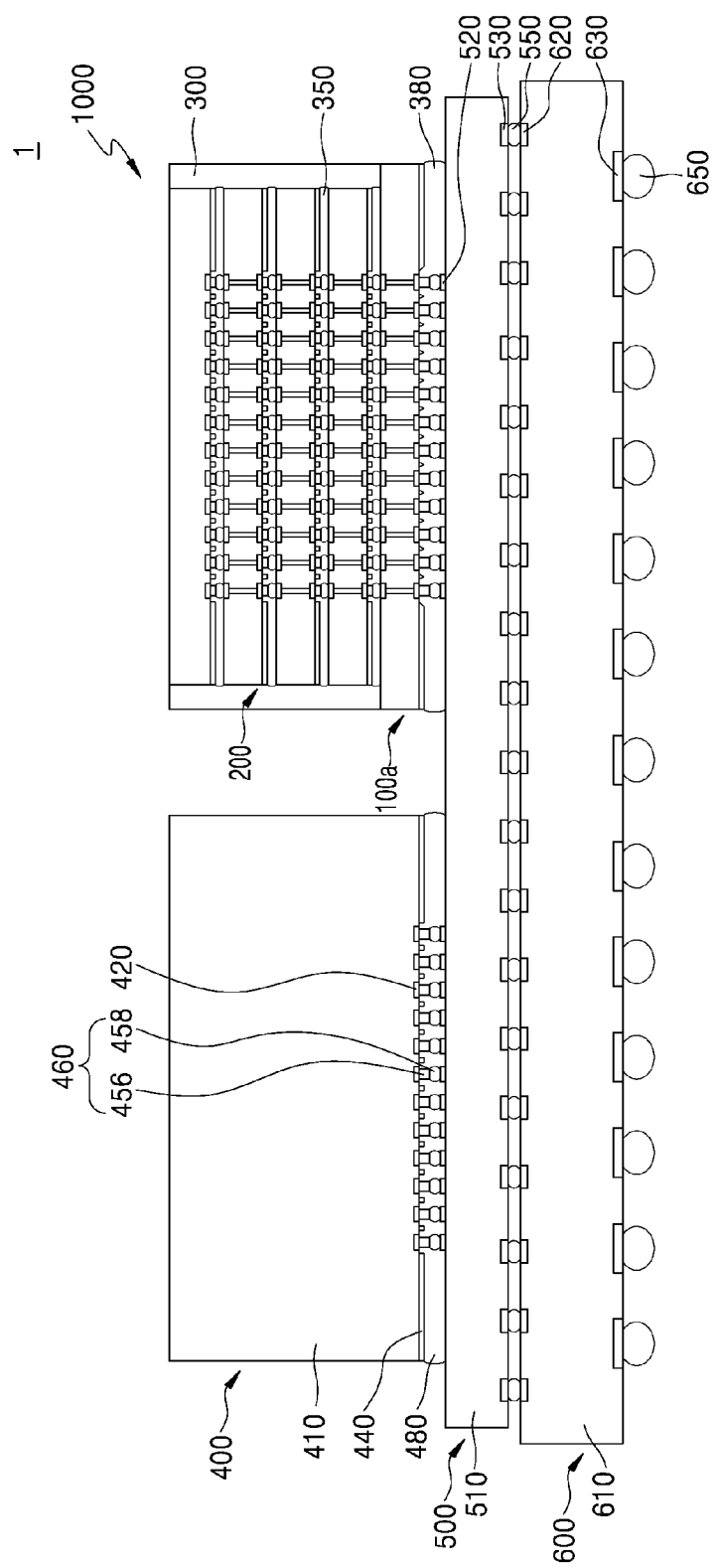
FIG. 10 is a cross-sectional view illustrating a system including a semiconductor package, according to an embodiment.

FIG. 10 is a cross-sectional view illustrating a system 1 including a semiconductor package according to an embodiment.

Referring to FIG. 10, the system 1 may include a semiconductor package 1000 including a first semiconductor chip 100a and a plurality of second semiconductor chips 200, an interposer 500 with a third semiconductor chip 400 attached thereon, and a main board 600 with the interposer 500 mounted thereon. The interposer 500 may be directly mounted on the main board 600 (e.g., without any other chips or substrates therebetween), the third semiconductor chip 400 may be directly mounted on the interposer 500 (e.g., without any other chips or substrates therebetween), and the stack of semiconductor chips including the first semiconductor chip 100a and the plurality of second semiconductor chips 200 (which together form a semiconductor package) may be directly mounted on the interposer 500 (e.g., without any other chips or substrates therebetween) to be horizontally adjacent to the third semiconductor chip 400. Thus, the semiconductor package of FIG. 10 may be a package-on-package device. Also, the package including the first semiconductor chip 100a and the plurality of second semiconductor chips 200 may be a package according to the embodiments discussed above in connection with FIG. 4.

The third semiconductor chip 400 may include a third semiconductor substrate 410, a third connection pad 420, a third insulation layer 440, and a third connection bump 460 including a third conductive pillar 456 and a third conductive cap 458. The third semiconductor substrate 410 and the third connection pad 420 are elements substantially similar to the semiconductor substrate 110 and the connection pad 120 illustrated in FIG. 1, the third insulation layer 440 is an element substantially similar to the second insulation layer 240 illustrated in FIG. 4, and the third connection bump 460 is an element substantially similar to the first connection bump 160 or the second connection bump 260 illustrated in FIG. 4. Hereinafter, therefore, their detailed descriptions are omitted.

The third semiconductor chip 400 may be a processor chip, such as, for example, a central processing unit (CPU) chip, a graphics processing unit (GPU) chip, or an application processor (AP) chip.

The interposer 500 may include a base layer 510, a first top pad 520 disposed on an upper surface of the base layer 510, and a first bottom pad 530 disposed on a lower surface of the base layer 510.

The base layer 510 may include a semiconductor, glass, ceramic, or plastic. For example, the base layer 510 may include silicon. A wiring layer connected to the first top pad 520 and/or the first bottom pad 530 may be disposed on the upper surface and/or the lower surface of the base layer 510, and an internal through electrode which electrically connects the first top pad 520 to the first bottom pad 530 may be provided in the base layer 510. The first connection bump 160 of the semiconductor package 1000 and the third connection bump 460 of the third semiconductor chip 400 may be connected to the first top pad 520.

A first underfill layer 380 may be provided between the semiconductor package 1000 and the interposer 500, and a second underfill layer 480 may be provided between the third semiconductor chip 400 and the interposer 500. The first underfill layer 380 and the second underfill layer 480 may respectively surround the first connection bump 160 and the third connection bump 460.

A first connection terminal 550 may be attached on the first bottom pad 530. The first connection terminal 550 may electrically connect the interposer 500 to the main board 600.

The main board 600 may include a base board layer 610, a second top pad 620 disposed on an upper surface of the base board layer 610, and a second bottom pad 630 disposed on a lower surface of the base board layer 610.

In some embodiments, the main board 600 may be a printed circuit board (PCB). For example, the main board 600 may be a multi-layer PCB. The base board layer 610 may include at least one material selected from among phenol resin, epoxy resin, and polyimide. The base board layer 610 may include, for example, at least one material selected from among frame retardant 4 (FR4), tetrafunctional epoxy, polyphenylene ether, epoxy/polyphenylene oxide, bismaleimide triazine (BT), thermount, cyanate ester, polyimide, and a liquid crystal polymer.

A solder resist layer exposing the second top pad 620 may be formed on the upper surface of the base board layer 610, and a solder resist layer (not shown) exposing the second bottom pad 630 may be formed on the lower surface of the base board layer 610. The first connection terminal 550 may be connected to the second top pad 620, and a second connection terminal 650 may be connected to the second bottom pad 630. The first connection terminal 550 may electrically connect the first bottom pad 630 to the second top pad 620. The second connection terminal 650 connected to the second bottom pad 630 may perform a function of an external connection terminal.

In some embodiments, the system 1 may not include the main board 600, and the first connection terminal 550 of the interposer 500 may perform the function of the external connection terminal.

The semiconductor device according to the embodiments described herein may include an insulation layer which is spaced apart from a connection bump to surround the connection bump and has a multi-layer structure where at least two horizontal parts are provided to have a step height therebetween. The insulation layer may cover a relatively large portion of an upper surface of a semiconductor substrate, and a space between a conductive pillar of the connection bump and the insulation layer is largely secured.

Therefore, a defect which occurs because a portion of an adhesive layer remains between the conductive pillar and the insulation layer is prevented in a process of manufacturing a semiconductor chip and a process of manufacturing a semiconductor package including the semiconductor chip, and thus, the reliability of the semiconductor chip is ensured, thereby ensuring the reliability of the semiconductor package including the semiconductor chip.

While the inventive concept has been particularly shown and described with reference to embodiments thereof, it will be understood that various changes in form and details may be made therein without departing from the spirit and scope of the following claims.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Unless the context indicates otherwise, terms such as "about" or "approximately" may reflect amounts, sizes, orientations, or layouts that vary only in a small relative manner, and/or in a way that does not significantly alter the operation, functionality, or structure of certain elements.

Terms such as "same," "equal," "planar," or "coplanar," as used herein encompass near identicality including variations that may occur, for example, due to manufacturing processes. The term "substantially" may be used herein to emphasize this meaning, unless the context or other statements indicate otherwise.

What is claimed is:
1. A semiconductor device comprising:
a semiconductor substrate;
a connection pad disposed on the semiconductor substrate;
a first insulation layer disposed on the connection pad;
a second insulation layer disposed on the first insulating layer, the second insulation layer including a first portion and a second portion that is disposed on the first portion; and
a base pillar disposed on the connection pad and being spaced apart from the second insulation layer, the base pillar including a first portion that passes through the first insulation layer and contacts the connection pad, and a second portion that is disposed on the first portion;

wherein the first insulation layer contacts a side surface of the first portion of the base pillar, a bottom surface of the second portion of the base pillar, and a top surface of the connection pad, and wherein a distance between the second portion of the base pillar and the first portion of the second insulation layer is less than a distance between the second portion of the base pillar and the second portion of the second insulation layer in a horizontal direction.

2. The semiconductor device of claim 1, wherein at least one of the first insulation layer, and the first portion and the second portion of the second insulation layer includes an inclined side wall.

3. The semiconductor device of claim 1, wherein the first portion and the second portion of the second insulation layer comprise an integrally-formed insulation layer.

4. The semiconductor device of claim 1, wherein the connection pad includes aluminum.

5. The semiconductor device of claim 1, wherein a horizontal width of the first portion of the second insulation layer is greater than a horizontal width of the second portion of the second insulation layer.

6. The semiconductor device of claim 1, wherein an angle of inclination of a side wall of the first portion of the second insulation layer relative to an upper surface of the semiconductor substrate is greater than or equal to an angle of inclination of a side wall of the second portion of the second insulation layer relative to the upper surface of the semiconductor substrate.

7. The semiconductor device of claim 1, wherein an angle of inclination of a side wall of the first portion of the second insulation layer relative to an upper surface of the semiconductor substrate is less than an angle of inclination of a side wall of the second portion of the second insulation layer relative to the upper surface of the semiconductor substrate.

8. The semiconductor device of claim 7, wherein the angle of inclination of the side wall of the second portion of the second insulation layer is about 70 degrees and the angle of inclination of the side wall of the first portion of the second insulation layer is in a range between about 40 degrees to about 50 degrees.

9. The semiconductor device of claim 1, wherein a horizontal width of the first portion of the base pillar is less than a horizontal width of the second portion of the base pillar.

10. The semiconductor device of claim 1, wherein the first insulation layer includes silicon oxide, and the second insulation layer includes photosensitive polyimide (PSPI).

11. The semiconductor device of claim 1, wherein a top surface of the base pillar is higher than a top surface of the second insulation layer.

12. A semiconductor device comprising:
a semiconductor substrate;
a connection pad disposed on the semiconductor substrate;
a base pillar disposed on the connection pad, the base pillar including a first portion and a second portion that is disposed on the first portion;
a first insulation layer disposed on the semiconductor substrate and including silicon oxide; and
a second insulation layer disposed on the first insulation layer and including photosensitive polyimide (PSPI), the second insulation layer including a first portion and a second portion that is disposed on the first portion,
wherein at least one of the first insulation layer and the second insulation layer is spaced apart from the base pillar, wherein a distance between the base pillar and the first portion of the second insulation layer is less than a distance between the base pillar and the second portion of the second insulation layer in a horizontal direction, and wherein at least one of the first insulation layer, and the first portion and the second portion of the second insulation layer includes an inclined side wall.

13. The semiconductor device of claim 12,
wherein the first portion of the base pillar passes through the first insulation layer and contacts the connection pad, and
wherein the first insulation layer contacts a side surface of the first portion of the base pillar, a bottom surface of the second portion of the base pillar, and a top surface of the connection pad.

14. The semiconductor device of claim 12, wherein a top surface of the base pillar is higher than a top surface of the second insulation layer.

15. The semiconductor device of claim 12, wherein the first insulation layer is spaced apart from a side wall of the base pillar.

16. The semiconductor device of claim 12, wherein a horizontal width of the first portion of the second insulation layer is greater than a horizontal width of the second portion of the second insulation layer.

17. The semiconductor device of claim 12, wherein a horizontal width of the first portion of the base pillar is less than a horizontal width of the second portion of the base pillar.

18. The semiconductor device of claim 12, wherein the connection pad includes aluminum.

19. A semiconductor device comprising:
an interposer;
a buffer chip disposed on the interposer, the buffer chip including:
a first substrate;
a first connection pad disposed on a lower surface of the first substrate;
a first base pillar disposed on the first connection pad, the first base pillar electrically connected to the interposer;
a second connection pad disposed on an upper surface of the first substrate;
a first through electrode electrically connecting the first connection pad to the second connection pad; and
a first insulation layer disposed on the lower surface of the first substrate and including a first opening,
wherein a first side wall of the first insulation layer defining the first opening includes a horizontal step,
wherein the first base pillar passes through the first opening of the first insulation layer and contacts the first connection pad, and
wherein the first insulation layer is spaced apart from the first base pillar; and
a plurality of high bandwidth dynamic random access memory chips disposed on the buffer chip, each of the high bandwidth dynamic random access memory chips including:
a second substrate;
a third connection pad disposed on a lower surface of the second substrate;
a second base pillar disposed on the third connection pad, the second base pillar electrically connected to the second connection pad of the buffer chip; and a second insulation layer disposed on the lower surface of the second substrate and including a second opening, wherein a second side wall of the second insulation layer defining the second opening does not include a horizontal step, wherein the second base pillar passes through the second opening of the second insulation layer, and wherein the second base pillar contacts the third connection pad.

20. The semiconductor device of claim 19, wherein the first side wall of the first insulation layer includes an upper side wall above the horizontal step that is inclined toward the first base pillar and a lower side wall below the horizontal step that is inclined toward the first base pillar.

* * * * *